United States Patent
Yee et al.

(10) Patent No.: US 7,459,346 B2
(45) Date of Patent: Dec. 2, 2008

(54) INTRINSIC THERMAL ENHANCEMENT FOR FBGA PACKAGE

(75) Inventors: Pak Hong Yee, Singapore (SG); Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 273 days.

(21) Appl. No.: 11/089,254

(22) Filed: Mar. 24, 2005

(65) Prior Publication Data

US 2005/0186704 A1    Aug. 25, 2005

Related U.S. Application Data

(62) Division of application No. 10/172,922, filed on Jun. 17, 2002, now Pat. No. 7,138,711.

(30) Foreign Application Priority Data

May 30, 2002 (SG) .............................. 200203244-9

(51) Int. Cl.
*H01L 21/50* (2006.01)
*H01L 21/48* (2006.01)
*H01L 21/44* (2006.01)

(52) U.S. Cl. .................. 438/122; 438/121; 438/106

(58) Field of Classification Search .............. 438/106, 438/121, 122; 257/706, 707, 719, 720, E23.101
See application file for complete search history.

(56) References Cited

U.S. PATENT DOCUMENTS

| | | | |
|---|---|---|---|
| 5,561,322 A | 10/1996 | Wilson | 257/703 |
| 5,640,048 A | 6/1997 | Selna | 257/738 |
| 5,811,879 A | 9/1998 | Akram | 257/723 |
| 6,048,755 A | 4/2000 | Jiang et al. | 438/118 |
| 6,117,705 A | 9/2000 | Glenn et al. | |
| 6,117,797 A | 9/2000 | Hembree | 438/759 |
| 6,122,171 A | 9/2000 | Akram et al. | 361/704 |
| 6,218,731 B1 | 4/2001 | Huang et al. | 257/738 |
| 6,229,204 B1 | 5/2001 | Hembree | 257/675 |
| 6,236,116 B1 | 5/2001 | Ma | 257/796 |
| 6,268,650 B1 | 7/2001 | Kinsman et al. | 257/691 |
| 6,282,094 B1 | 8/2001 | Lo et al. | |
| 6,297,960 B1 | 10/2001 | Moden et al. | 361/719 |

(Continued)

*Primary Examiner*—Luan Thai
(74) *Attorney, Agent, or Firm*—Whyte Hirschboeck Dudek SC

(57) ABSTRACT

A semiconductor device for dissipating heat generated by a die during operation and having a low height profile, a semiconductor die package incorporating the device, and methods of fabricating the device and package are provided. In one embodiment, the semiconductor device comprises a thick thermally conductive plane (e.g., copper plane) mounted on a thin support substrate and interfaced with a die. Thermally conductive via interconnects extending through the substrate conduct heat generated by the die from the conductive plane to conductive balls mounted on traces on the opposing side of the substrate. In another embodiment, the semiconductor devices comprises a thick thermally conductive plane (e.g., copper foil) sandwiched between insulative layers, with signal planes (e.g., traces, bonding pads) disposed on the insulative layers, a die mounted on a first signal plane, and solder balls mounted on bonding pads of a second signal plane. A thermally conductive via interconnect extends through the substrate to provide a thermal path from the die and signal plane (traces) through the thick conductive plane and into the solder balls and external device (e.g., mother board). The present semiconductor device provides effective heat dissipation without the attachment of an external heat sink or spreader.

27 Claims, 14 Drawing Sheets

U.S. PATENT DOCUMENTS

| | | | |
|---|---|---|---|
| 6,320,253 B1 | 11/2001 | Kinsman et al. | 257/686 |
| 6,337,228 B1 | 1/2002 | Juskey et al. | 438/122 |
| 6,359,341 B1 | 3/2002 | Huang et al. | |
| 6,372,552 B1 | 4/2002 | Kinsman et al. | 438/124 |
| 6,376,908 B1 | 4/2002 | Gaku et al. | 257/707 |
| 6,416,625 B1 | 7/2002 | Wang et al. | 162/156 |
| 6,426,875 B1 | 7/2002 | Akram et al. | 361/704 |
| 6,462,274 B1 | 10/2002 | Shim et al. | 174/52.4 |
| 6,493,229 B2 | 12/2002 | Akram et al. | 361/704 |
| 6,534,861 B1 | 3/2003 | Castro | 257/734 |
| 6,657,296 B2 | 12/2003 | Ho et al. | |
| 6,867,493 B2 | 3/2005 | Hashemi et al. | 257/717 |
| 6,882,042 B2 | 4/2005 | Zhao et al. | 257/706 |

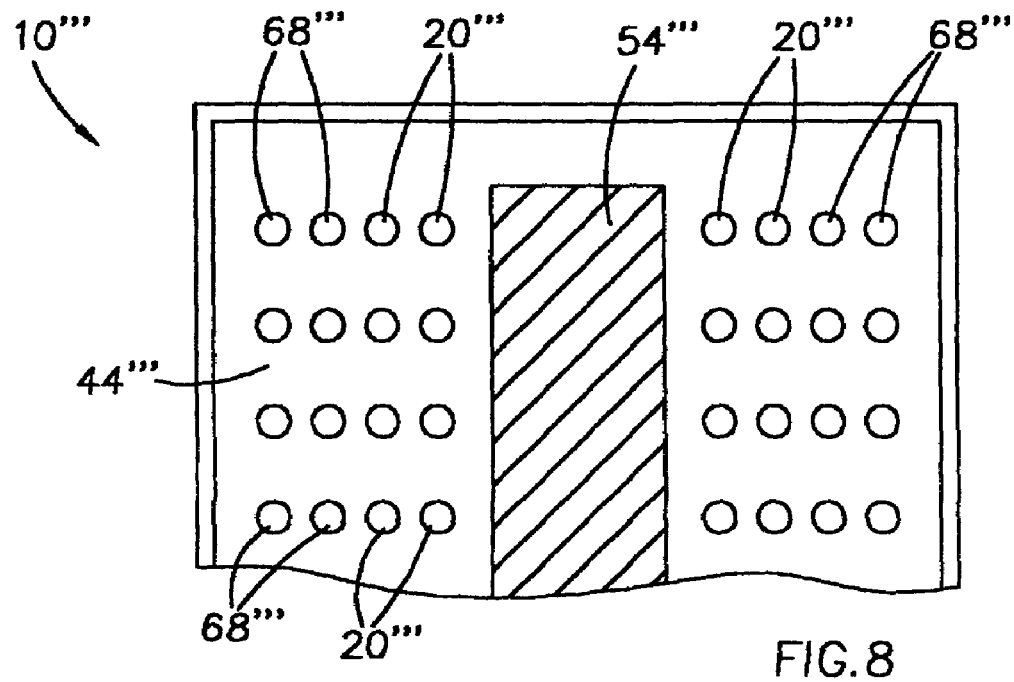
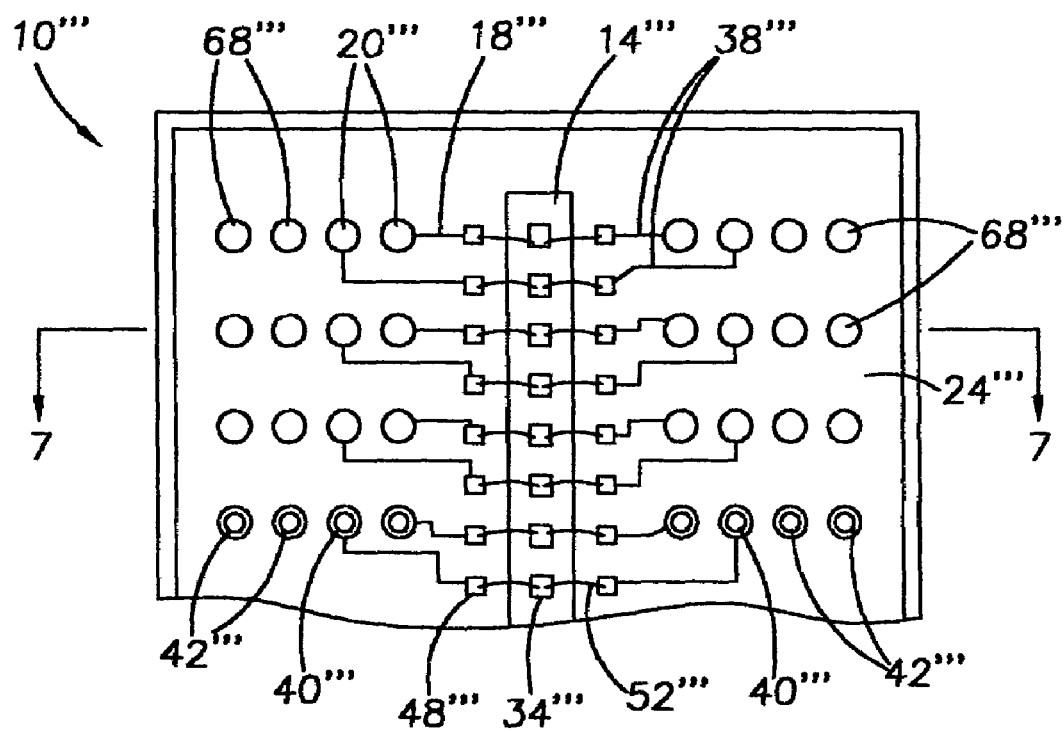

US 7,459,346 B2

INTRINSIC THERMAL ENHANCEMENT FOR FBGA PACKAGE

CROSS-REFERENCE TO RELATED APPLICATION

This application is a division of U.S. patent application Ser. No. 10/172,922, filed Jun. 17, 2002.

FIELD OF THE INVENTION

This invention relates in general to semiconductor devices and, more particularly, to a semiconductor device assembly having a integral heat sink for high power dissipation.

BACKGROUND OF THE INVENTION

An important characteristic of an electronic package is its ability to transfer heat out of the integrated circuit (IC) chip in order to ensure its proper operation and reliability. A considerable amount of heat is generated by the internal and surface circuits including transistors, resistors, capacitors, and other electronic components of an integrated circuit (IC) device. Fine ball grid arrays (FBGA) have superior electrical performance and has gained in popularity in memory packaging. As semiconductor devices become more dense, heat generation has greatly increased, requiring package construction that will transfer heat out of the IC chip in order to ensure its proper operation and reliability. However, the smaller package outline of an FBGA reduces the surface area essential for thermal heat transfer.

Conventional approaches to addressing thermal issues is by extrinsically mounting a passive heat transfer device, or heat sink, to the surface of the die. For example, heat spreaders and extruded or pins fin type of heat sinks have been mounted on the active surface of a semiconductor die to absorb heat from the IC die and dissipate the heat by convection into the air. However, these extrinsic heat sink structures substantially increase the size and complexity of a semiconductor device, and do not address the problem of achieving enhanced microchip cooling in a simple, low-cost packaging arrangement. Applications in the area of hand-held and mobile products require space constraints in package height, thus eliminating the possibility of using extrinsic heat spreaders and heat sinks.

Conventional methods of increasing the number of copper substrate layers, using a thicker copper ground plane layer, or using a higher thermal conductivity mold compound can be effective for thermal enhancement of high pin count packages such as a plastic quad flat pack (PQFB) and plastic ball grid array (PBGA) configuration. However, these approaches provide negligible impact on an FBGA-BOC package due, at least in part, to the much thinner package structure and small surface area in the memory application.

Thus it would be desirable to improve FBGA thermal performance and package reliability while maintaining a thin die package profile.

SUMMARY OF THE INVENTION

The present invention provides a semiconductor device, semiconductor die package incorporating the device, and methods of fabricating the device and packages.

In one aspect, the invention provides a semiconductor device. In one embodiment, the semiconductor device comprises an insulative support substrate (dielectric interposer) disposed between a semiconductor die and a ball grid array for communicating with an external device such as a mother board, and a thermally conductive plane layer disposed between the die and the support substrate. A soldermask can be applied over the thermally conductive plane layer and/or the conductive traces. The thermally conductive plane layer, which can be made of metal, has a thickness greater than the substrate layer and functions as a heat spreader to dissipate heat generated by the die and to provide structural support (stiffness). A die attach material in the form of a paste or tape, for example, can be used to mount the die on the thermally conductive plane layer.

Thermally conductive via interconnects extending through the insulative support substrate connect the thermally conductive plane layer to a conductive (signal) plane comprising conductive traces and ball contacts disposed on the opposing side of the support substrate. The thermally conductive plane layer dissipates the main bulk of heat away from the die during operation, which passes through the via interconnects and the traces into the ball contacts.

In an embodiment of the semiconductor device, the device can comprise a thick copper plane interposed between a dielectric interposer layer and a semiconductor die, and ball contacts mounted on ball bonding pads of a conductive (signal) layer on the underside of the dielectric interposer layer. The copper (heat sink) plane has a thickness greater than the dielectric interposer layer. Heat generated from the die passes into the copper layer and is conducted through copper plated via interconnects extending through the dielectric interposer layer into the ball contacts and to a mother board or other device on which the device is mounted.

In another embodiment, the semiconductor device comprises a substrate comprising a metal core layer interposed between a first signal plane layer and a second signal plane layer. A dielectric or insulative layer is interposed between the metal core (heat sink) layer and the two signal plane layers. A semiconductor die is disposed on the first signal plane layer, and a plurality of ball contacts are disposed on bonding pads of the second signal plane layer. Heat generated by the die passes through thermally conductive via interconnects that extend through the substrate from the first signal plane layer through the metal core (heat sink) layer and into the ball contacts.

In a further embodiment, the semiconductor device comprises a semiconductor die disposed on a thermally conductive plane (heat sink) layer on one side of an insulative support substrate. Thermally conductive via interconnects extend through the insulative substrate to the heat sink layer. A conductive (signal) layer of electrically conductive traces overlies at least a portion of the second side of the insulative support substrate. A first array of electrically conductive ball contacts is disposed on bonding pads connected to the traces to provide signal interconnects between the die and an external device such as a mother board. In one embodiment, a second array of thermally conductive ball contacts that are not connected to signal traces ("dummy balls") are mounted on the second side of the support substrate in contact with the via interconnects to provide thermal grounding for cooling the device. Heat from the die passes through the thermally conductive plane (heat sink) layer through the via interconnects and into the thermally conductive dummy balls to a mother board or other external device on which the semiconductor device is mounted. In another embodiment, the second (thermal) ball array is connected by ground traces to the first (signal) ball array. The ground trace connection provides a thermal path from the metal plane layer (heat sink) to the first array of ball contacts, and a signal path from the first ball array to the metal plane (ground) layer. The ground trace connection provides a nearer return path for the signal trace to return to the external system ground such as a mother board ground, via the ball contacts for better signal integration of the system, and improved signal performance and solder joint reliability performance.

In another aspect, the invention provides a semiconductor die package. In various embodiments, the package comprises a semiconductor device according to the invention at least partially disposed within an encapsulating material.

In another aspect, the invention provides methods of fabricating the foregoing semiconductor devices and die packages.

In one embodiment of a method of fabricating a semiconductor device, the method comprises providing a support substrate having a predetermined thickness and a thermally conductive via interconnect extending therethrough; applying a thermally conductive heat sink layer onto the first surface of the support substrate in conductive contact with the thermally conductive via interconnect, the heat sink having a thickness that is greater than the thickness of the support substrate; forming a conductive (signal) plane layer comprising conductive traces and ball bonding pads on the second surface of the support substrate; mounting a semiconductor die on the heat sink layer; and mounting a plurality of ball contacts onto the ball bonding pads. In another embodiment, a prefabricated substrate comprising an insulative support substrate interposed between a thermally conductive heat sink layer and at least a conductive (signal) plane layer, and thermally conductive via interconnects extending through the insulative support, can be provided, and the die and ball contacts mounted thereon. The device can be encapsulated to form a die package by applying a molding compound to at least partially encapsulate the device. Typically the ball contacts are attached following the encapsulation step. The structure of the resulting device disperses heat generated by the die into the heat sink layer through the via interconnects through the traces and into the ball contacts, and into a mother board or other external substrate onto which the device has been mounted.

In yet another embodiment, a method for fabricating a semiconductor device comprises the steps of providing a thermally conductive (heat sink) layer (e.g., copper layer) having a predetermined thickness; applying a dielectric layer onto opposing surfaces of the heat sink layer; forming a via interconnect through the thickness of the heat sink layer and dielectric layers; forming first and second signal layers including conductive traces over the dielectric layers, with ball bonding pads also provided on the second signal layer on the underside of the device; mounting a semiconductor die on the first signal layer; and mounting ball contacts onto the ball bonding pads. Additional layers of thermally conductive material (e.g., copper layers) can be added by applying alternating conductive and dielectric layers, and forming the via interconnect therethrough. In another embodiment, a prefabricated substrate with the heat sink layer interposed between the dielectric layers and signal planes, and the thermally conductive via interconnects can be provided, and the die and ball contacts mounted thereon. The prefabricated substrate can comprise additional conductive layers and overlying dielectric layers. The device can be at least partially encapsulated with a molding compound to form a die package.

The resulting combination of a thick (copper) plane layer as a heat sink or heat spreader, a thin insulative support substrate, and additional sets of thermally conductive interconnect vias contact balls in excess of the typical number of contact balls (e.g., 54 balls, etc.) required in a standard FBGA package provides enhanced thermal performance of FBGA and BGA packages by reducing the junction temperature without the use of extrinsically attached heat sinks and heat spreaders. The present semiconductor device achieves a reduction of the junction temperature (Tj) up to about 10° C. compared to a package made with a single layer of copper traces on the underside of an insulative core substrate (e.g., FIG. 12) with no intrinsic heat sink layer interfacing with the die, and no thermally conductive interconnect vias through the substrate. The present device provides about the same thermal performance (about a 10° C. reduction in Tj) as a single copper layer design (FIG. 12) having an attached pin fin heat sink (8 mm height), but without such an extrinsic attachment.

The semiconductor device is capable of effectively conducting a relatively large amount of heat away from the package, an amount that is well in excess of that conveyed by conventional semiconductor packages. The present invention advantageously eliminates the need for attachment of an extrinsic heat sink or heat spreader while providing a means for dissipating or distributing heat from the semiconductor die without increasing the size or complexity of the device. This also results in cost savings by eliminating the attachment step of an extrinsic device at the module level.

The overall package height is maintained at a low profile by utilizing a thin support substrate and increasing the thickness of the thermally conductive plane layer (e.g., copper heat sink layer) to help stiffen the thin substrate. The low package height is attractive for memory application in the area of palm-top, lap-top or communication equipment such as mobile phones and wireless application protocol (WAP).

In addition, the heat sink layer (e.g., copper plane) can also function as a ground plane to improve the overall electrical performance in high frequency applications. The increased number of thermal contact balls (e.g., solder balls) at the package periphery also helps to improve package reliability for thermal stress in the solder joints, and helps eliminates possible package warping.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 8 is a plan view of the underside of the support substrate of the die package of FIG. 7, taken along line 8-8.

FIG. 9 is a plan view of the die package shown in FIG. 8 with the encapsulant over the bonding wires and the solder mask having been removed.

DETAILED DESCRIPTION OF THE PREFERRED EMBODIMENT

Figure 1:
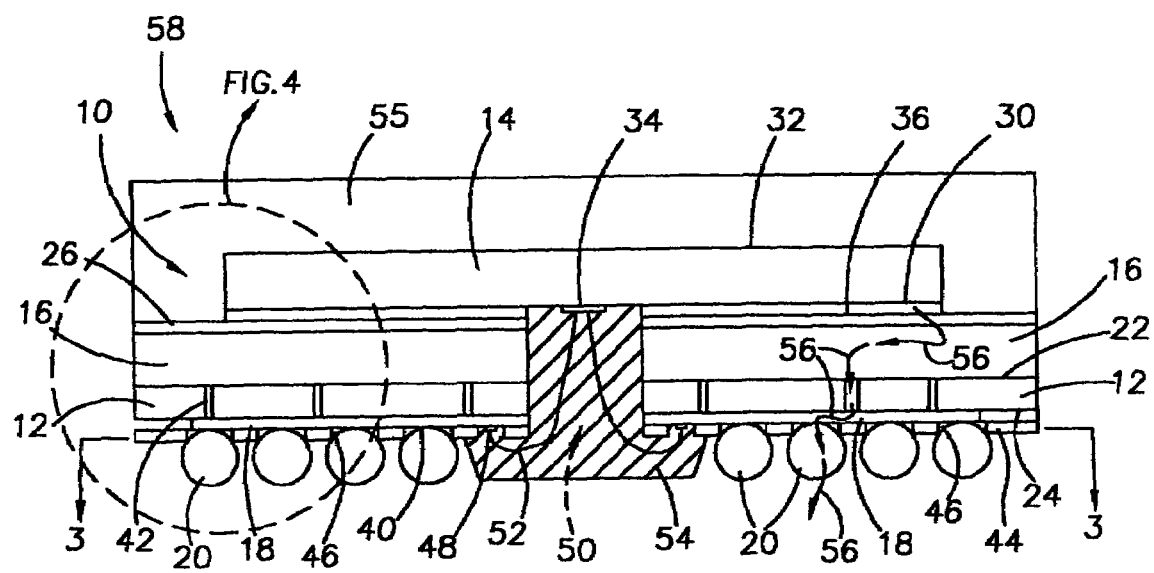
FIG. 1 is a cross-sectional, side elevational view of an encapsulated die package incorporating an embodiment of a semiconductor device according to the invention.
Figure 2:
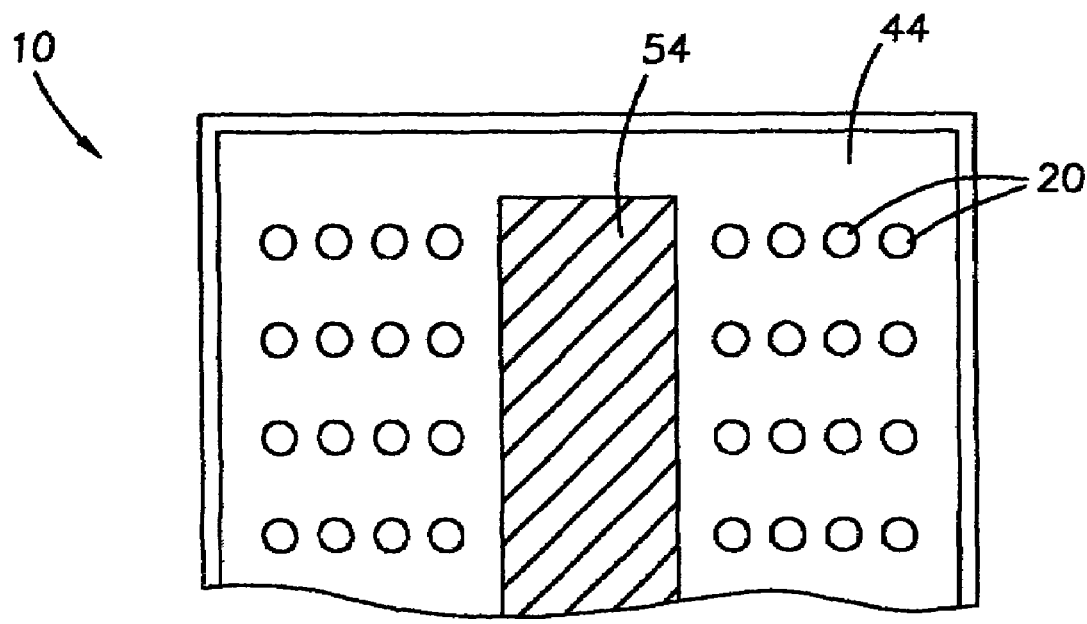
FIG. 2 is a plan view of the underside of the support substrate of the die package of FIG. 1, taken along line 2-2.

The invention will be described generally with reference to the drawings for the purpose of illustrating embodiments only and not for purposes of limiting the same.

Referring to FIGS. 1-4, a first embodiment of a semiconductor device 10 according to the invention is depicted. The semiconductor device 10 includes a support (core) substrate 12, a semiconductor die 14, a thermally conductive plane layer 16, a conductive (signal) plane layer 18, and ball contacts 20.

The support (core) substrate (interposer layer) 12 includes a first side 22, a second side 24, a predetermined thickness $t_1$, and comprises an electrically insulative (dielectric) material. In the illustrated embodiment, the support substrate 12 is formed of a thin, flexible material such a flexible polyimide film or tape (e.g., KAPTON brand film from DuPont, Wilmington, Del.; UPILEX from Ube Industries, Ltd., Japan; ESPANEX from Nippon Steel Chemical Co. Ltd.; and MICROLUX from Dupton), polytetrafluoroethylene (PTFE), liquid crystal polymer (LCP), polyester, epoxy, urethane, polystyrene, silicone, polycarbonate, for example. The substrate 12 can include adhesive layers on one or both sides thereof, for adhesively bonding the substrate to the thermally conductive plane layer 16 and/or the conductive plane layer 18. In other embodiments, the support substrate 12 can be formed of a more rigid material, for example, a known electrically insulating polymer material such as bismaleimide triazine (BT) resin or epoxy resins such as FR-4 or FR-5 laminates, for example, among other substrates. A representative thickness $t_1$ of the substrate is about 20 μm to about 150 μm (about 1 mil to about 6 mils).

The support substrate can also comprise a laminate of a porous, dielectric material such as fiberglass, impregnated with a thermosetting epoxy resin to form a stage-B epoxy resin composite. The term "stage-B" refers to a resin that is partially cured to a relatively soft, malleable solid with the solvent removed. Exemplary dielectric or insulative materials for the support substrate 12 include porous substrate materials such as fiberglass, interwoven Kevlar, carbon fiber, or Teflon-coated polymer fibers. Thermosetting resins include polyimide resin, epichloridehydrin bisphenol-A resin (epoxy), or bismaleimide triazine ("BT") resin, for example. A variety of composites of porous substrates impregnated with thermosetting resins, referred to in the industry as "core" are known in the art and available commercially. Core used for the fabrication of a support substrate typically has a thickness of ranging from about 20 μm to about 150 μm.

The thermally conductive plane layer 16 is disposed over the first side 22 of the support substrate 12 to form a heat sink at its interface with the die 14. The thermally conductive plane layer 16 can be formed of a stiff metal material. The thermally conductive plane layer 16 can comprise a highly conductive metal such as copper, plated copper, aluminum, gold, gold plated metals, nickel, or an alloy such as Ni—Pd. In the illustrated example, the thermally conductive plane layer 16 comprises a copper foil having a thickness $t_2$ of about 30 microns and above (about >1 mil). The thermally conductive plane layer 16 can be adhered to the support substrate 12, or formed on the substrate by a metal plating method, for example.

Optionally, a photosensitive soldermask material 26 can be applied, patterned, and stripped to form a desired pattern to protect the conductive plane layer 16.

The semiconductor die 14 can be mounted on the soldermask 26 or directly onto the thermally conductive plane layer 16 if no soldermask is applied. The die 14 includes a first (active) surface 30 and a second (inactive) surface 32. The active surface 30 includes a pattern of bond pads 34 in electrical communication with the integrated circuits contained on the die.

The die 14 can be mounted onto the soldermask 26 (or plane layer 16) by means of a thermally conductive adhesive layer 36 using a conventional die attacher. The thermally conductive adhesive layer 36 allows heat dissipation from the die to the thermally conductive plane layer 16. Useful die attach adhesive are known in the art and commercially available, and include contact adhesives, thermoplastic adhesives and thermosetting adhesives, for example, an adhesive gel or paste such as a conventional epoxy or polyimide die bonding adhesive, or a double-sided adhesive tape such as polyimide film coated on both sides with adhesive, and can be used to apply the die under pressure and/or heat. Exemplary adhesives include silver filled epoxy, polyimide pastes or pastes filled with boron nitride (BN), for example.

Figure 3:
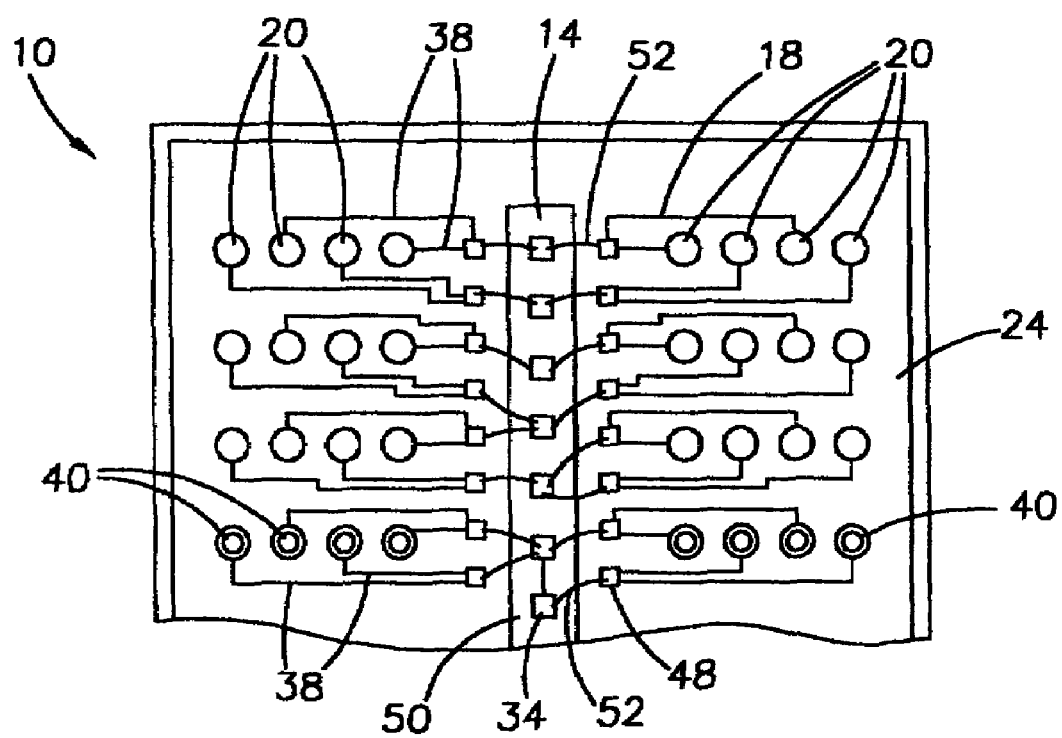
FIG. 3 is a plan view of the die package shown in FIG. 2, with the encapsulant over the bonding wires and the solder mask having been removed.

Referring to FIG. 3, the conductive plane layer 18 is disposed on the second side 24 of the support substrate 12. The conductive plane layer 18 comprises a pattern of electrically conductive traces 38 to form internal signal traces for the package. The conductive plane layer 18 comprises a highly conductive metal such as copper, aluminum, gold, and nickel, for example. The traces 38 can be formed on the underside 24 of the support substrate 12 using a subtractive process such as etching a plated or clad metal layer in a desired pattern, or using an additive process such as deposition of a metal through a mask. An exemplary thickness of the traces 38 is about 6 μm to about 50 μm (about 0.25 mil to about 2 mils).

Ball bonding pads 40 are formed on the conductive traces 38 for attaching the external ball contacts 20 such as solder balls. The ball bonding pads 40 are formed in a layout to allow the ball contacts to be arranged in a dense area array such as a ball grid array (BGA) or fine pitch ball grid array (FBGA). The ball contacts 20 can be arranged in one or more rows, or the balls may be provided in a non-linear arrangements (not shown). As shown, a ball grid array is formed of four rows of ball bonding pads 40.

Figure 4:
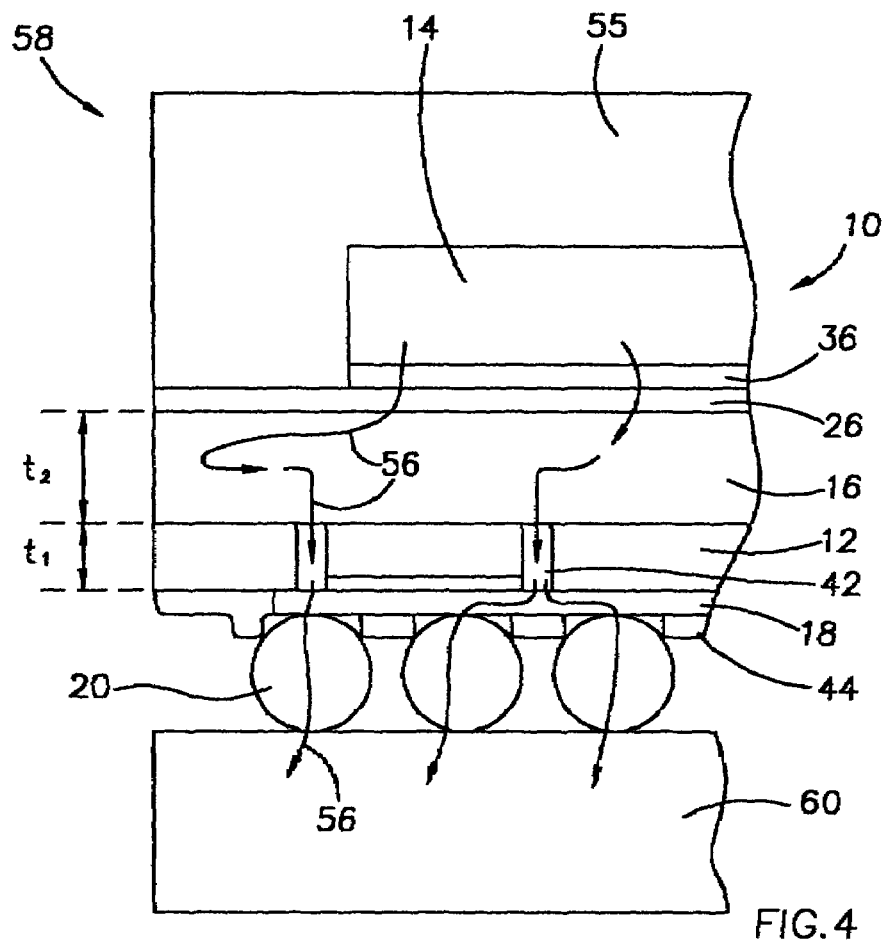
FIG. 4 is a partial view of the package of FIG. 1, showing the heat transfer pathway through the device.

Referring to FIG. 4, a plurality of via interconnects 42 are disposed through the support substrate 12 and connect the thermally conductive plane layer 16 to the conductive plane layer 18 on either side of the support substrate. The via interconnects 42 conduct heat (arrow 56) from the thermally conductive plane layer 16 into the conductive plane layer 18. The via interconnects 42 can be fabricated using known technology in the industry. For example, the via interconnects 42 can be provided as plated-through holes comprising a thermally conductive material such as copper, formed through the thickness of the substrate and including a ring pad to which a solder ball pad 40 is connected by a trace (e.g., "dog bone" design). To save space on the underside of the substrate for routing traces and to shorten the path between the via interconnects and the thermal ball contacts, the via interconnects 42 can be fabricated, for example, as vias on the upper and lower surfaces of the substrate to a depth to make contact with trace 18 or ball contact 20 for thermal conductance through the substrate, or as a pad-on-via (pad-in-via) whereby a solder ball pad 40 is fabricated over the ring pad of a plated-through hole.

A second photosensitive soldermask material 44 can be optionally applied over the conductive traces 38, patterned, and stripped to form a desired pattern to protect the traces 38. The soldermask 44 includes openings 46 that align with the ball bonding pads 40 and wire bonding pads 48 on the substrate 12. The soldermask 44 prevents solder from attaching to the conductive traces 38 except at the selected openings 46 formed through the mask.

In the illustrated example, the support substrate 12 and thermally conductive plane layer 16 define an elongate opening or slot 50, formed by stamping, for example, through which a bonding wire 52 (e.g., gold) extends to connect the bond pads 34 of the semiconductor die 14 to the wire bonding pads 48 on the underside 24 of the support substrate 12. The bonding pads 48 are in electrical connection with the ball contacts 20. A conventional wire bonder can be used to wire bond the bonding wires 52.

Figure 5:
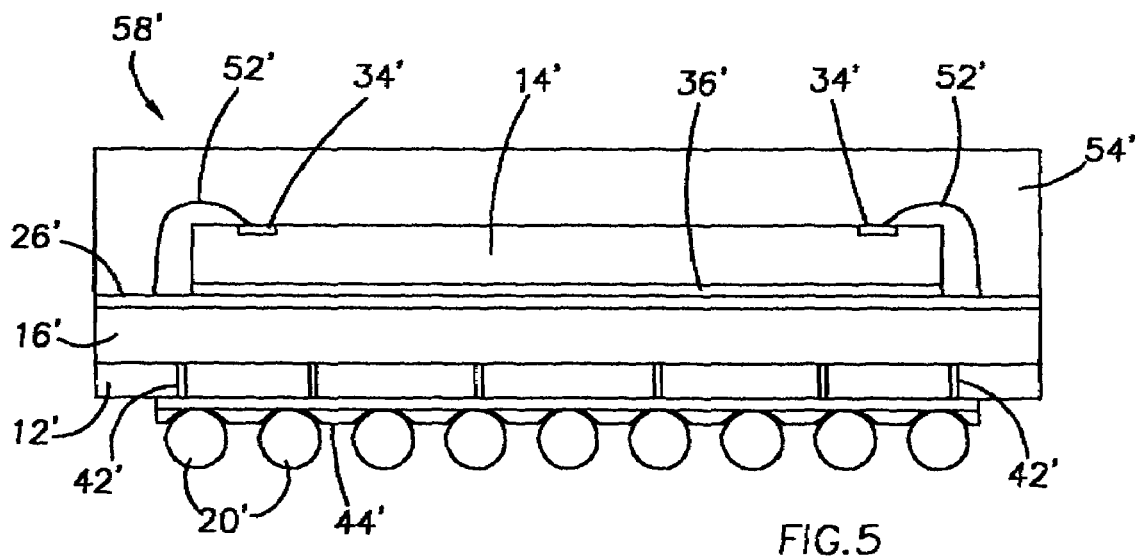
FIG. 5 is another embodiment of a semiconductor device according to the invention comprising a die having peripheral bond pads wire bonded to the conductive plane layer.

Referring to FIG. 5, in another embodiment of a semiconductor device 10', according to the invention, a die 14' having center or peripheral bond pads 34', as shown, on the active surface 30' can be mounted via the inactive surface 32' onto the soldermask 26' (or directly on the conductive plane layer 16' if no soldermask 26' is applied) using an adhesive layer 36', with the active surface 30' facing upward (i.e., die facing up). The bond pads 34' can be connected by bonding wires 52' to contacts on the conductive plane layer 16'.

Following wire bonding, the bonding wires 52 and the die 14 can be encapsulated with a dielectric encapsulation material 54, 55 such as a novolac-based epoxy, using known methods in the art such as a glob top encapsulation or by a transfer molding process, to form an encapsulated BGA semiconductor package 58.

A plurality of ball contacts 20 are attached to the ball bonding pads 40 for connecting the die package 58 to a circuit board, mother board or other electrical apparatus 60. Exemplary ball contacts 20 comprise solder typically comprising tin (Sn) and/or lead (Pb), or a conductive material such as a conductive epoxy or conductor-filled epoxy. The ball contacts 20 are mounted on the ball bonding pads 40 through the openings 46 in the soldermask 44. The ball contacts 20 can be attached using conventional surface mount processes and equipment, by mounting and reflowing the solder ball contacts to mechanically bond the contacts to the ball bonding pads 40, or by mounting and curing in the case of conductive polymer bumps, although other methods such as thermal compression can also be used.

As depicted in FIG. 4, the package 58 can be mounted (e.g., solder mounted) to a main board or mother board 60, for example. The electrical input/output (I/O) terminals of the BGA package 58 comprise a plurality of ball contacts 20 attached to the ball bonding pads 40 on the underside of the support substrate 12.

A thermal path (arrow 56) can be defined between the die 14 and the ball contacts 20 connected to a mother board 60, for example. Heat generated by the semiconductor die 14 during operation is conducted away through the thermally conductive plane layer 16 into the via interconnects 42, through the conductive plane layer 18, and into (and through) the conductive balls 20 to the mother board 60 or other external device.

Figure 6:
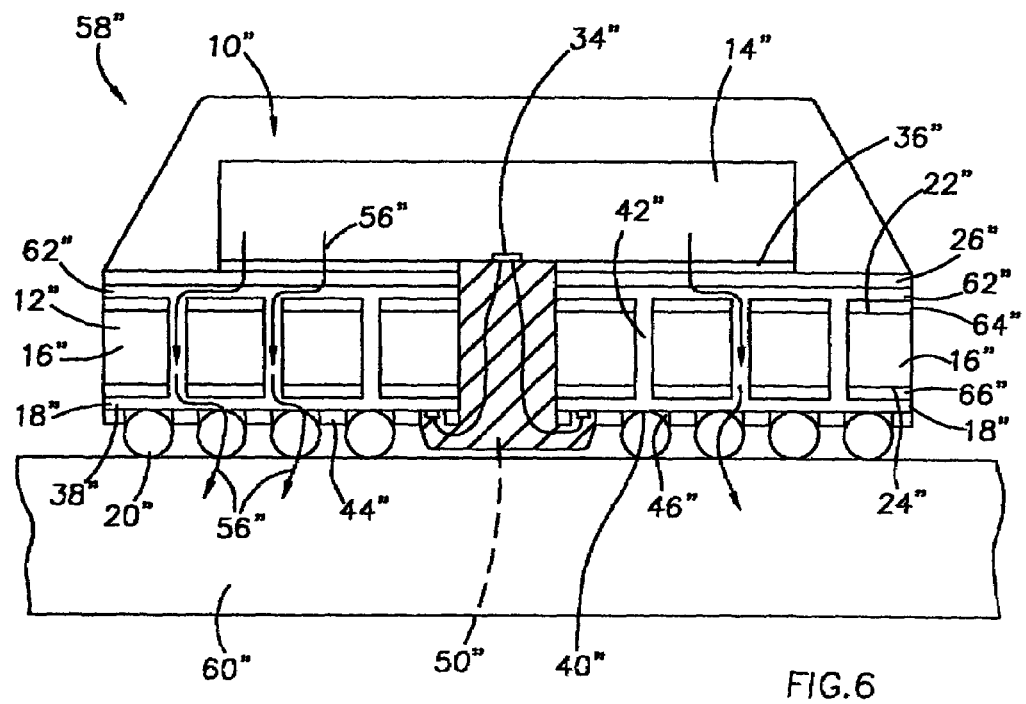
FIG. 6 is a cross-sectional, side elevational view of an encapsulated die package incorporating another embodiment of a semiconductor device according to the invention.

Referring now to FIG. 6, another embodiment of a package 58" incorporating a semiconductor device 10" according to the invention is depicted in a cross-sectional, side elevational view.

The package 58" comprises a semiconductor device 10" that includes a support (core) substrate 12", a semiconductor die 14", conductive (signal) plane layers 18", 62", and ball contacts 20". In the illustrated example, the die 14" has central bond pads 34" wire bonded to the signal plane layer 18" through an opening 50" in the support substrate 12" and plane layer 16". It is understood that the device 10" can incorporate a die having peripheral or central bond pads and mounted as a die facing up, as illustrated in FIG. 5.

The support (core) substrate 12" comprises a thermally conductive plane layer 16" to form a heat sink for conduction of heat generated by the semiconductor die 14". Typically, the thermally conductive plane layer 16" comprises a highly conductive metal such as copper or aluminum, among others. In the illustrated example, the thermally conductive plane layer 16" comprises a layer of copper foil having a thickness of about 30 μm and above (about >1 mil).

A dielectric layer 64", 66" is applied to either side 22", 24" of the core substrate 12" to insulate the core substrate from the overlying conductive (signal) plane layers 18", 62". An exemplary material for the dielectric layers 64", 66" comprises stage-B epoxy resin, or "pre-preg" laminate, such as a stage-B epoxy/fiberglass composite.

The conductive (signal) plane layer 62" comprises a pattern of electrically conductive traces and contact pads to form routing signal traces for the overlying die 14". A soldermask 26" can optionally be applied to protect the signal traces of the conductive (signal) plane layer 62". The die 14" can be mounted onto the soldermask 26" or directly onto the thermally conductive (metal) plane layer 16" in a flip chip attachment using an adhesive attachment 36".

The conductive (signal) plane layer 18" is similar to the conductive plane layer 18" described with reference to the embodiment of FIG. 1. The conductive plane layer 18" comprises a pattern of electrically conductive traces 38" of copper, for example, and ball bonding pads 40" in a BGA or FBGA layout. As shown, a soldermask 44" overlies the conductive traces 38", and includes openings 46" to the ball bonding pads 40".

Following wire bonding, the semiconductor device 10" can be encapsulated to form the semiconductor package 58". The ball contacts 20" can then be attached to the ball bonding pads 40", and the package 58" can be mounted to the mother board 60".

A plurality of via interconnects 42" are disposed through the dielectric layers 64", 66" and the support substrate 12" (thermally conductive plane layer 16"). The via interconnects 42" form a conduit or pathway 56" for conducting heat generated by the die 14" to the ball contacts 20" and into the mother board 60", for example, the via interconnects 42" can be formed by known techniques, for example, as plated-through holes comprising a thermally conductive material such as copper, or using pad-in-via (pad-on-via) technology, for example, to save space on the underside 24" of the substrate for routing traces and to shorten the thermal path between the via interconnect and the thermal ball contacts.

In other embodiments, the semiconductor device can comprise additional thermally conductive layers as desired to increase heat dissipation.

Figure 7:
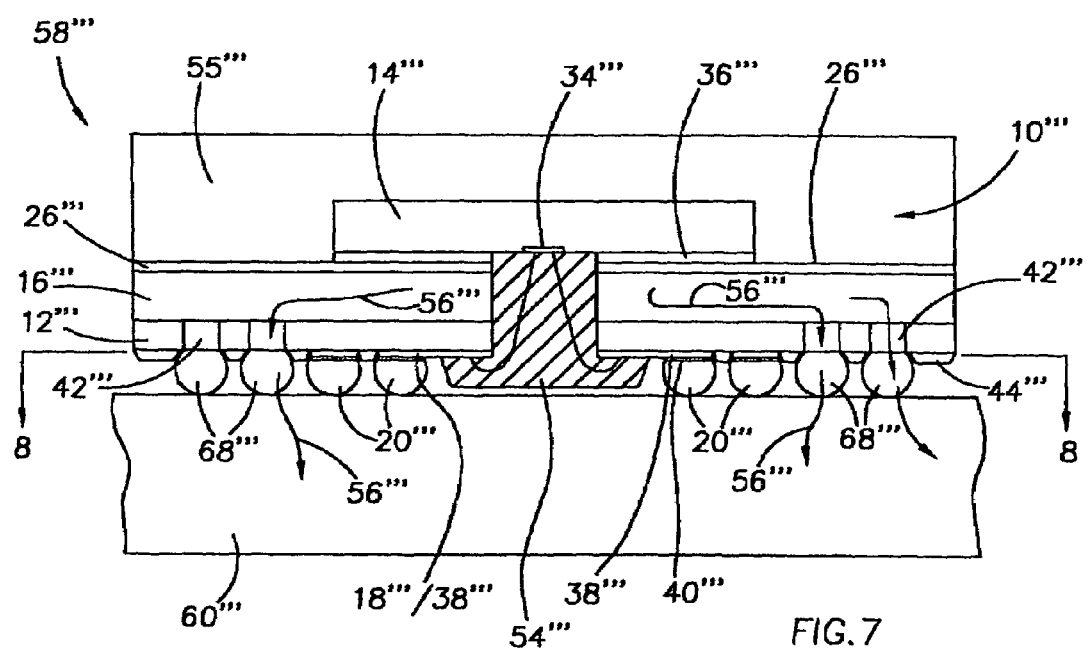
FIG. 7 is a cross-sectional, side elevational view of an encapsulated die package incorporating another embodiment of a semiconductor device according to the invention.

A die package 58''' incorporating another embodiment of a semiconductor device 10''' according to the invention is illustrated in FIGS. 7-9. As shown, the device 10''' includes a support substrate 12''' comprising an electrically insulative material such a flexible polyimide film or tape, for example. A thermally conductive plane layer 16''' comprising a copper foil, for example, is attached to the substrate 12''' with an overlying soldermask layer 26'''. The die 14''' is flip chip mounted onto the soldermask layer 26'''. It is understood that device 10''' can incorporate a die facing up having peripheral or center die pads, and mounted as depicted in FIG. 5.

A conductive (signal) plane layer 18''' comprising conductive traces 38''' and ball bonding pads 40''' are disposed on the underside of the support substrate 12'''. A soldermask 44''' is disposed over the conductive traces 38''' with openings to the ball bonding pads 40'''. Ball contacts 20''' are mounted on the ball bonding pads 40''' for providing an electrical connection between the die 14''' and an external device 60''' such as a mother board.

In the present embodiment, a plurality of thermally conductive via interconnects 42''' extend through the support substrate 12''', and a second array of ball contacts 68''' are mounted on the substrate 12''' in contact with the via interconnects 42'''. As shown in FIG. 9, the ball contacts 68''' are "dummy balls" in that the balls are not connected to signal traces and do not function to conduct electrical signals from the die 14''' to an external device 60'''. Rather, the ball contacts 68''' function as thermal conductors to convey heat generated during operation of the die 14''' into the external device 60'''. Heat from the die 14''' is conducted into the plane layer 16''' and through the via interconnects 42''' into the thermal ball contacts 68''' (arrows 56'''), and passes into the external device 60'''.

In a low pin count packaging, not all of the ball contacts in an array are required for signal interconnection to a mother board or other external device. According to the invention, an excess of dummy balls 68''' are disposed onto open spaces (areas) on the underside 24''' of the support substrate 12''' in contact with via interconnects 42''' and the conductive plane layer 16''' to provide thermal grounding for cooling the device by passage of heat from the die 14''' through the conductive plane layer 16''' and into the thermal ball contacts 68'''. Not being connected to traces of the signal plane layer 18''', the ball contacts 68''' are not utilized for signal purposes and thus function as "dummy balls".

Figure 10:
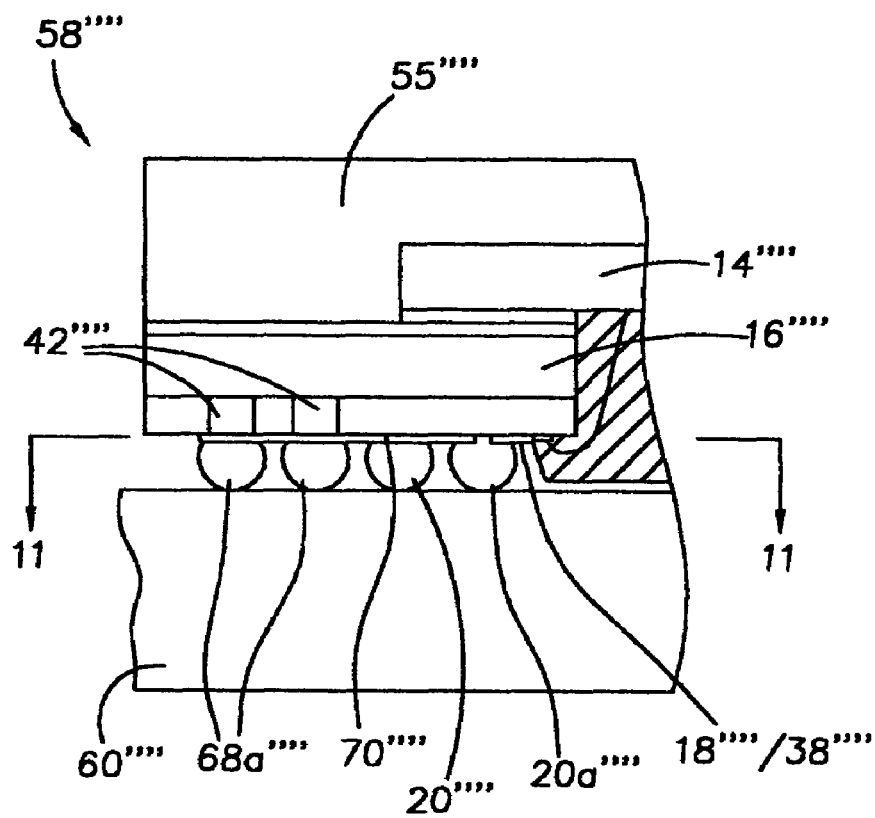
FIG. 10 is a partial cross-sectional, side elevational view of an encapsulated die package incorporating another embodiment of a semiconductor device according to the invention.
Figure 11:
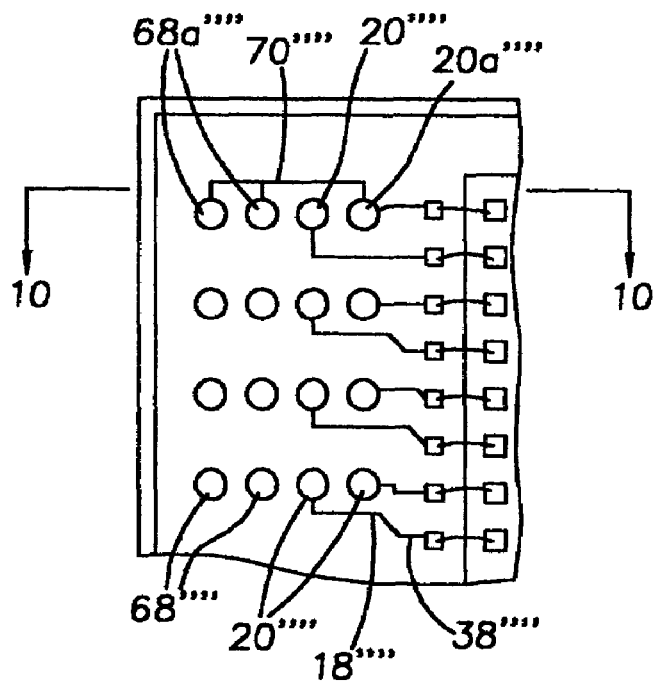
FIG. 11 is a plan view of the underside of the die package of FIG. 10, taken along line 11-11, with the encapsulant over the bonding wires having been removed.

Referring to FIGS. 10-11, in another embodiment of the semiconductor device 10'''' according to the invention, a ground ball contact 20a'''' assigned as a ground signal (VSS) pin for a return path to the ground of the system mother board 60'''', is connected by a ground trace 70'''' to ball contacts 68a'''' of the second ball array, which are dummy balls for thermal conduction. The other illustrated ball contacts 20'''' comprise signal pins such as data pins, clock pins, or other function signal pins. The signal traces 38'''' to ball contacts 20'''' provide an electrically conductive signal path from the die 14'''' to ball contacts 20a'''' and 20''''. The ground traces 70'''' between the VSS signal ball contact 20a'''' and the dummy ball contacts 68a'''' provide a return signal path from the VSS signal ball contacts 20a'''' to the ground layer 16'''' for better signal integration of the system, and improved signal performance and solder joint reliability performance. The ground traces 70'''' also provide a thermally conductive path from the dummy ball contacts 68a'''' to the VSS ball contacts 20a'''' and onto the system mother board 60''''. Thus, VSS ball contacts 20a'''' and ground traces 70'''' provide both an electrical (signal) path and a thermal path to an external device 60'''', provided the ball contact 20a'''' is a ground pin (VSS).

It is understood that in certain applications, a finned heat sink or other extrinsic structure as known in the art (not shown), can be attached to the top of the package for enhanced convection-air cooling.

EXAMPLE

Sensitivity Test Study of Substrate Construction and Heat Spreading Attachment

Figure 12:
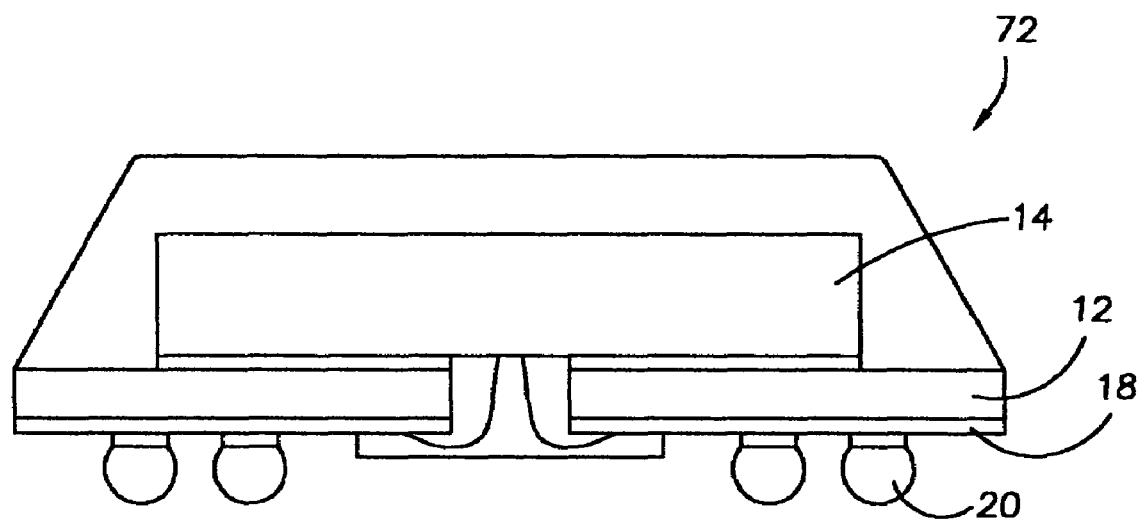
FIG. 12 is a cross-sectional, side elevational view of a prior art die package having a single copper plane layer.

A sensitivity test study was conducted to determine the effects of substrate constructions and heat spreading attachments at natural and forced convection. The following substrate constructions were examined:

a) A prior art semiconductor device 72 having a single metal layer construction ("single layer"), as depicted in FIG. 12. The device 72 comprised a support (core) substrate 12 made of bismaleimide triazine (BT) resin, a semiconductor die 14, a conductive (signal) plane layer 18 made of copper traces, and solder ball contacts 20.

b) An embodiment of a semiconductor device according to the invention having a two metal layer construction ("2-layer"), as depicted in FIG. 1. The 2-layer device 10 had a thick copper plane layer 16, a support (core) substrate 12 made of BT resin, copper traces 18, and solder ball contacts 20.

c) An embodiment of a semiconductor device according to the invention having a four metal layer construction (4-layer), similar to the device 10 depicted in FIG. 1. The device included a thick copper plane layer, a support (core) substrate made of BT resin, copper traces, solder ball contacts, and two additional copper plane layers located between the core substrate and the copper plane layer and the copper trace layer.

Substrates with varying thicknesses of the copper plane layer and the insulative core substrates were tested. Also tested were the effects of via interconnects, thermal via/balls and their quantity on the thermal performance of the substrates, and the addition of a heat spreader or heat sink to the package. Junction temperature (Tj) versus power was measured for each parameter to assess thermal performance.

Methodology

1) Simulation tool. Flotherm, a thermal analysis software written in Finte-Volume-Analysis code developed based on CFD was used in which the physics of solid to fluid flow and heat transfer by conduction, convection and radiation were captured to simulate the actual thermal behavior of objects involved in the analysis.

2) Measurement. Five units of 54FBGA-BOC were characterized based on the JEDEC Standard EIA/JESD 51-21) for Natural Convection.

3) Package level modeling and boundary conditions. A detailed model containing the package details was first constructed. The actual sample of the 54 Ball FBGA package was then validated by experiment. Simulations as well as measurement were carried out at 18.5° C. ambient and power at 0.5, 1, 1.5 and 2 watts. Subsequent models were built by modification from this validated model. An assumption was made that the subsequent derived models maintained accuracy of the validated model.

4) Parameters. The sensitivity test for the following parameters were investigated in the design of FBGA-BOC.

Intrinsic Substrate Parameters.
a) Number of interconnect VIAs.
b) Number of additional thermal VIAs/balls.
c) Number of layers.
d) Core thickness.
e) Copper plane thickness.
f) Mold compound thermal conductivity.

Extrinsic Substrate Parameters.
a) Heat spreader.
b) Heat sink (extruded and pins fin type).
c) Forced convection (air flow).

TABLE 1

DUT and thermal test board details.

| | |
|---|---|
| Package Size | 13 × 13 × 1.13 (mm) |
| Chip Size | 9.07 × 10.88 × 0.279 (mm) |
| Pin Count | 54 balls (9 × 6), 4-row depopulated |
| Test Board Size | 101.6 × 114.3 × 1.57 (mm) |

TABLE 2

Material Property used in simulation.

| Material | Thermal Conductivity (W/m/° C.) |
|---|---|
| Silicon | 150 |
| Mold Compound | 0.7 |
| BT Substrate | 0.35 |
| Solder Ball | 50 |
| Polyimide Tape | 0.2 |
| Test Board - FR4 | 0.29 |
| Polypropylene | 0.03 |
| Test Board Copper | 390 |

Validation

A still air setup enclosure, test jig and package under-test sitting on test board were used as per standard EIA/JESD$_{51-2}$.

The single-layer substrate package with actual Rambus device was first simulated and measured to correlate accuracy of the model.

Figure 13:
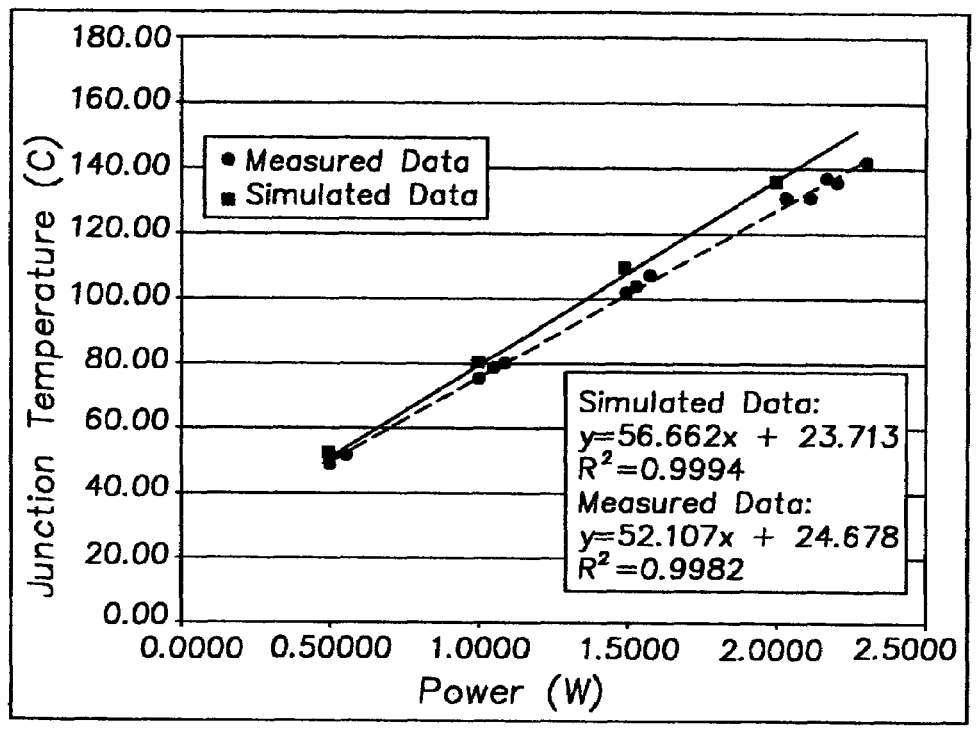
FIG. 13 is a graphical depiction of experimental validation of single-layer 54FBGA-BOC substrate model, junction temperature Tj (C) versus power (W).

FIG. 13 graphically illustrates experimental validation of single-layer 54 FBGA-BOC substrate model junction temperature Tj (C) versus Power (W). The simulated data: y=56.662x+23.713; $R^2$=0.9994. The measured data: y=52.107x+24.678; $R^2$=0.9982. The data showed that the model and measurement correlation was accurate within 10%.

Results and Discussion

Figure 14:
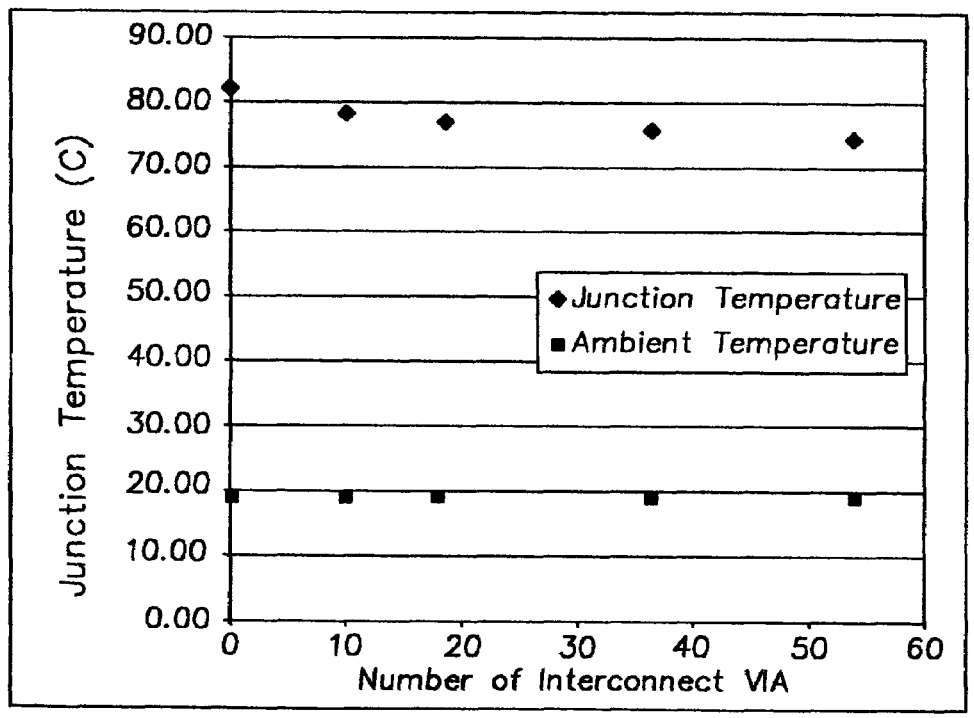
FIG. 14 is a graphical depiction of junction temperature Tj (C) versus number of interconnect vias (at 1W, 2-layer, 18.5C Ambient).

In FIG. 14, the junction temperature Tj (C) versus the number of interconnect via shows that as the number increases, the junction temperature reduces at a rate approximately −0.12° C. per via. This rate is considered small and inefficient in reducing the Tj.

Figure 15:
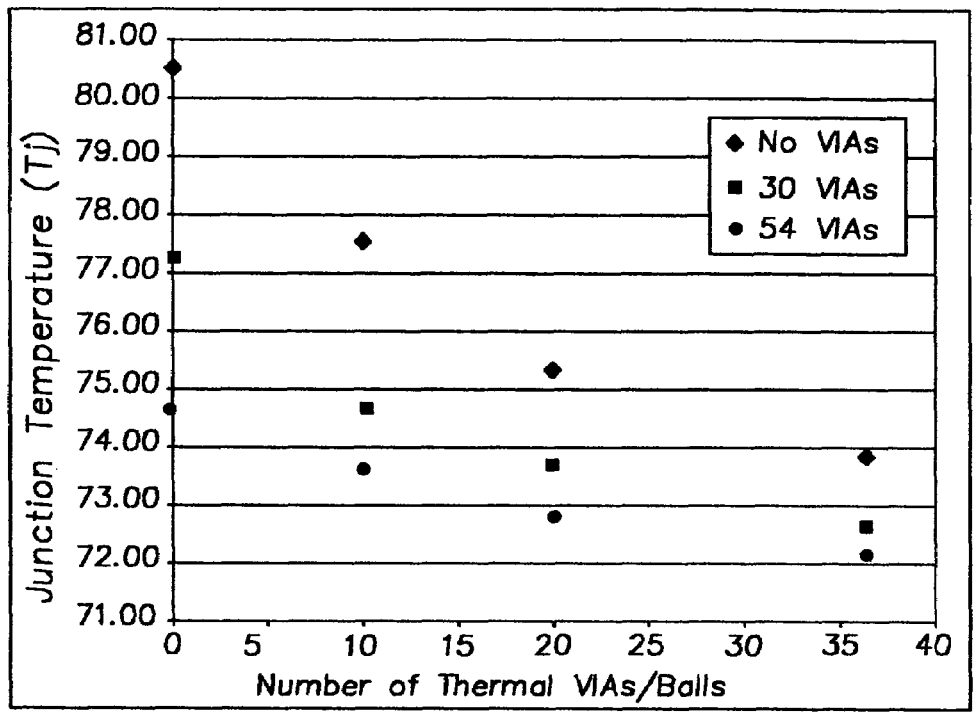
FIG. 15 is a graphical depiction of junction temperature Tj (C) versus the number of thermal vias/balls in a 54FBGA-BOC construction (1W, 2-layer, 18.5C Ambient).

However, as shown in FIG. 15, if the substrate is redesigned into a two-layer board with extra rows of thermal vias and solder ball pair connected to a copper ground plane, the junction temperature was found more effectively reduced.

Figure 16:
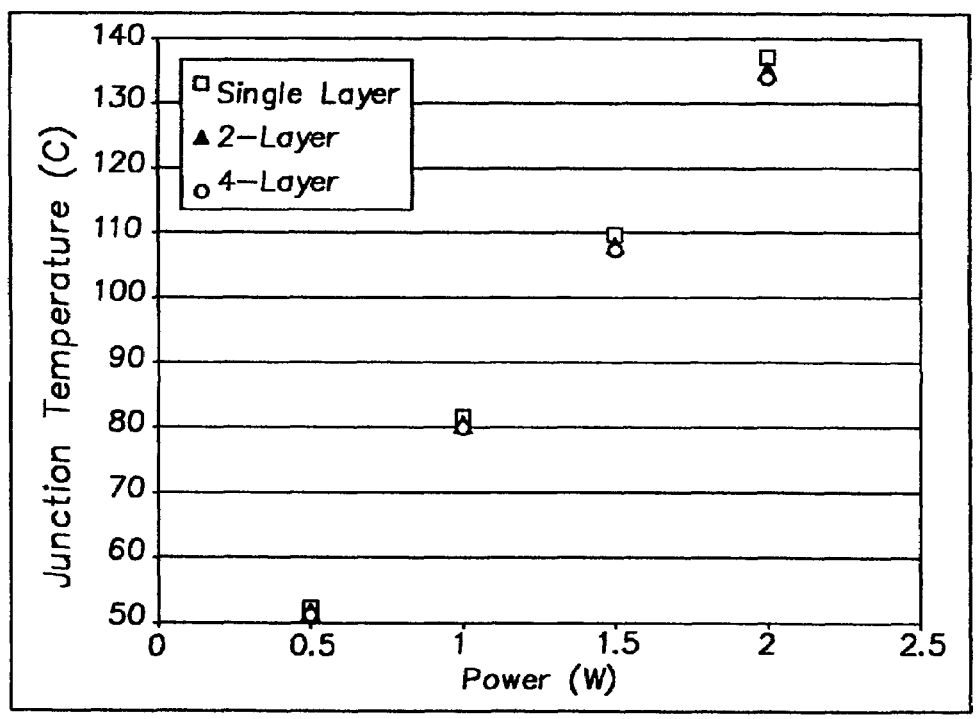
FIG. 16 is a graphical depiction of junction temperature (C) versus power (W) for various substrate constructions.

The effect of the number of substrate layers in the FBGA-BOC substrate construction were next investigated. As shown in FIG. 16, the results indicate that as the number of substrate layers increased, the more the junction temperature was reduced. However, the amount of the reduction was in the order of only 1-2° C. For example, at Ta=18.5° C. and 1 W power, a ΔTj of −1.34° C. was the result between a single-layer and a 4-layer construction.

Figure 17:
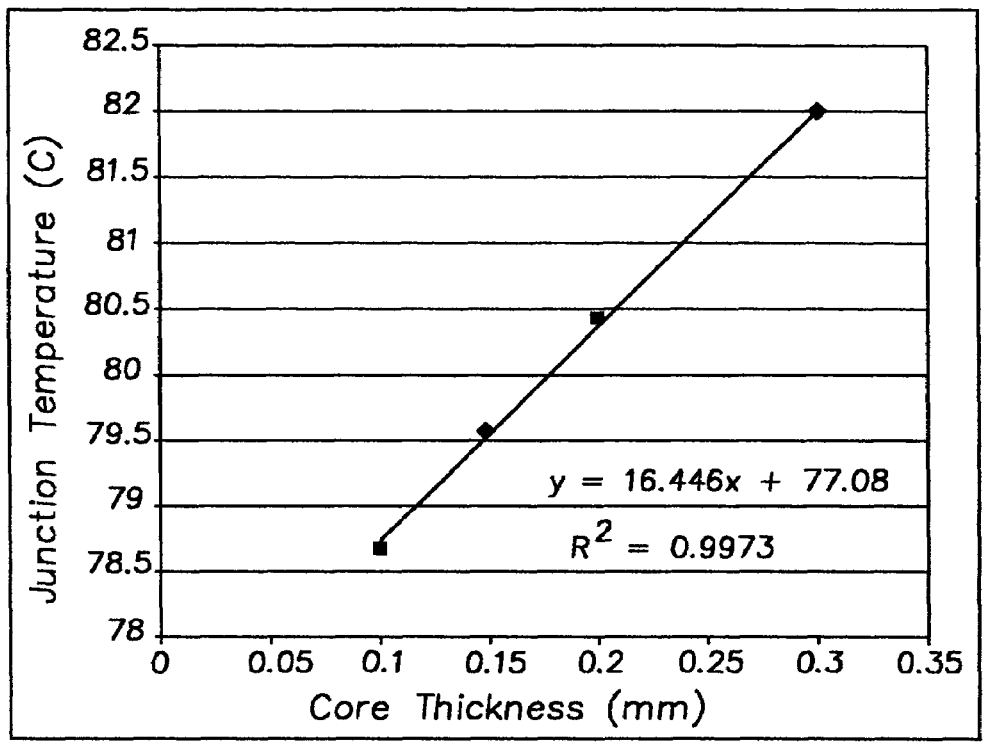
FIG. 17 is a graphical depiction of the junction temperature (C) versus core substrate thickness (mm).

The results of junction temperature (C) versus core (substrate) thickness are depicted in FIG. 17. The junction temperature decreased with decreasing core thickness. The core material is a poor thermal conductor and therefore thinner core substrates conduct heat better than thicker cores. The degree of Tj reduction was not significant.

Figure 18:
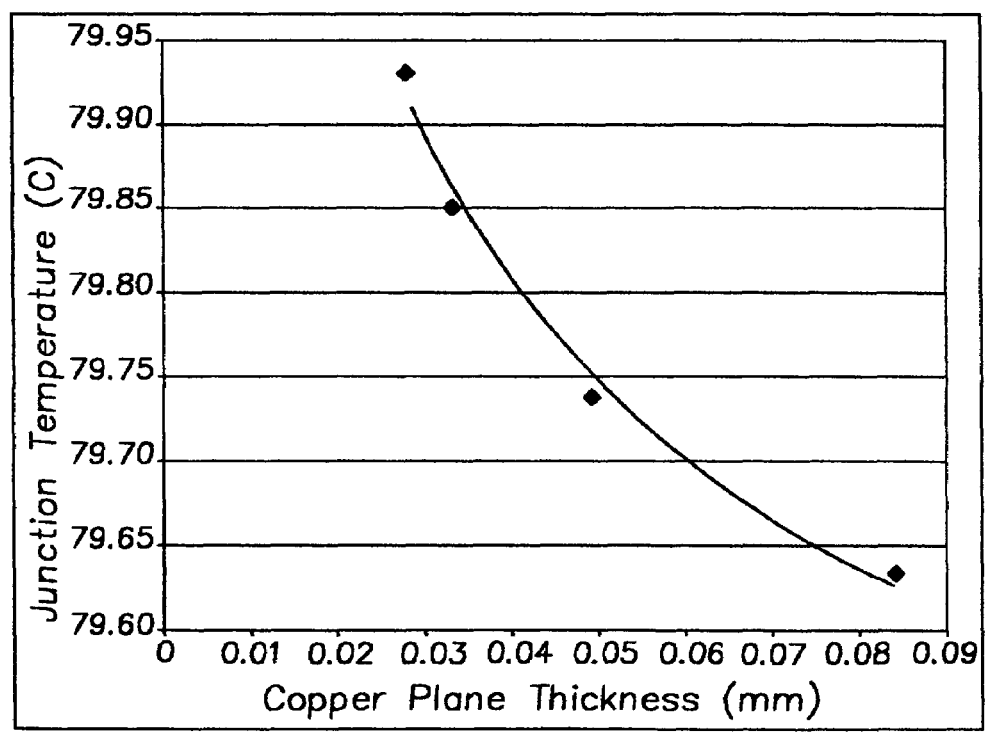
FIG. 18 is a graphical depiction of the junction temperature (C) versus copper plane thickness (mm) in a two (copper) layer substrate.

As shown in FIG. 18, the junction temperature (C) decreased with increasing copper plane thickness. However, the impact was unexpectedly insignificant in FBGA design.

Figure 19:
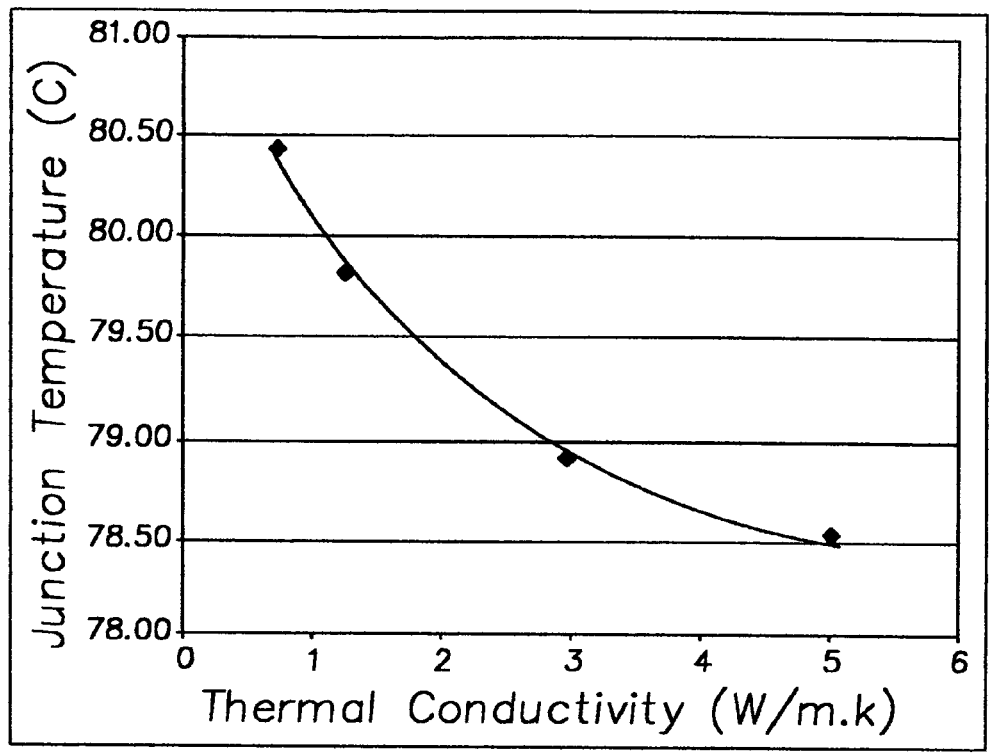
FIG. 19 is a graphical depiction of the junction temperature (C) versus thermal conductivity (W/m·k) of mold compound in a single (copper) layer substrate.

The contribution of a high thermal conductivity mold compound to lower the junction temperature was also investigated in this study. The results are depicted in FIG. 19. The junction temperature (C) was reduced with higher thermal conductive mold compounds. However, the impact was not so significant, and was in the order of only about 2° C.

In summary, the traditional methods of increasing the number of core layers, using a thicker copper plane layer, or using a higher thermal conductivity mold compound may be effective for PQFP and PBGA thermal enhancement. However, according to the simulation results shown in FIGS. 16, 18 and 19, these had a negligible impact on the FBGA-BOC package due, at least in part, to its thin inner package structure and small surface area in memory application. On the other hand, it was found that thermal performance can be maximized when interconnect vias and thermal vias/balls (dummy balls and vias) are added to occupy substantially all of the footprint to maximize the ball grid area of the 2-layer substrate design.

The extrinsic parameters were next investigated.

The junction temperature of a semiconductor device can usually be reduced more effectively by forced convection such as using a fan.

Per JESD51-6 standard on Forced Convection[2], there is an option of vertical and horizontal placement of the thermal board in the characterization of junction-to-air thermal resistance under moving air. Simulation results performed under JESD51-6 environment setup showed that, at 1 W and ambient 18.5° C., the resulting junction temperature under forced convection was cooler in the case where the thermal board was placed horizontally. The reason was partly due to a stronger interaction with gravity when the board was placed vertically. Therefore, the vertical placement offered a more stringent condition. Furthermore, vertical placement would be a more appropriate setup as it is aligned with the module application.

Figure 20:
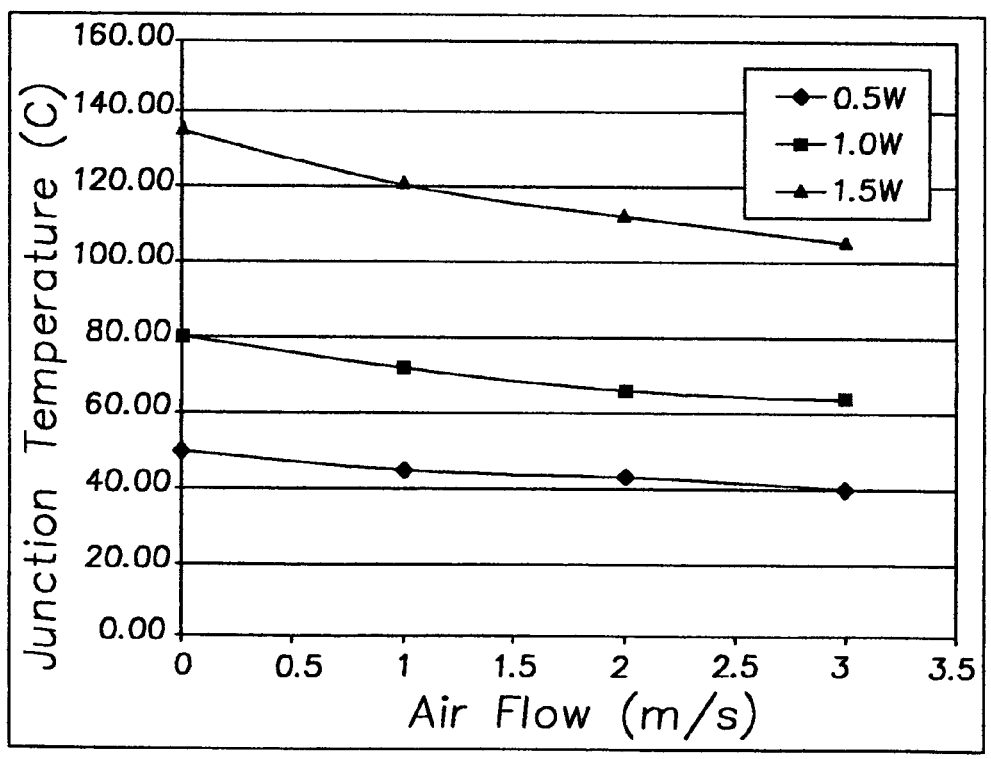
FIG. 20 is a graphical depiction of the junction temperature (C) versus airflow (m/s) in forced convection, with the package in a vertical placement.

The simulation result of assessing vertical placement forced convection is depicted in FIG. 20. The junction temperature Tj (C) was significantly reduced at different airspeeds (m/s).

Figure 21:
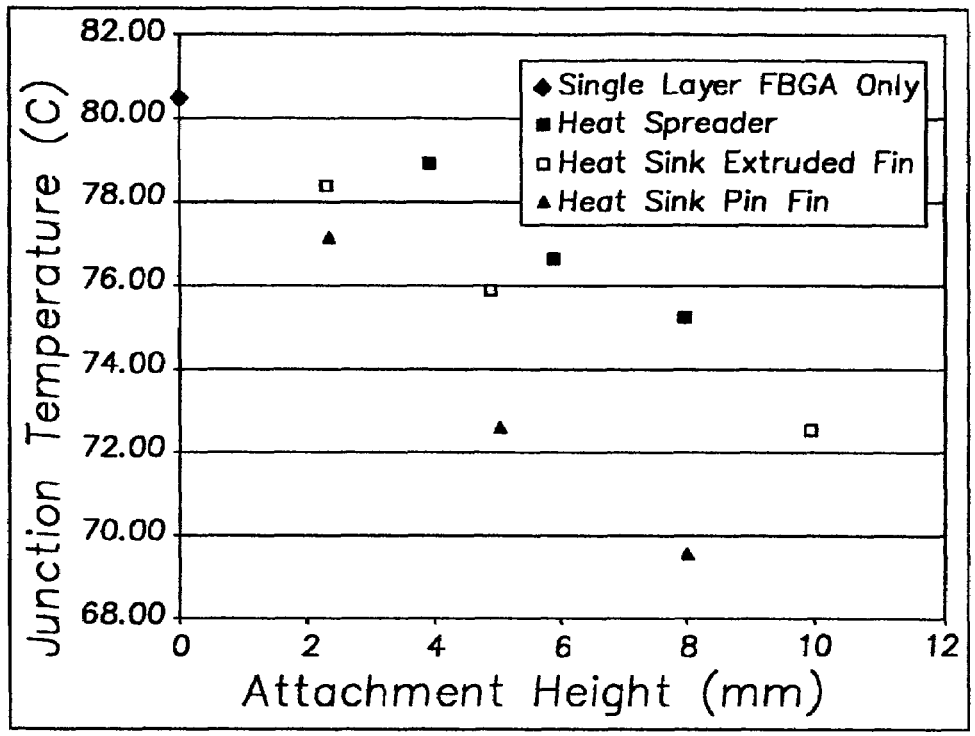
FIG. 21 is a graphical depiction of the junction temperature (C) versus height (mm) of various heat dissipation attachments including heat spreader and heat sink (extruded and pin types).

Package heat transfer can be greatly improved by attachment of heat spreader or heat sink to increase the area for convection. The plot of junction temperature (C) versus height (mm) of the heat spreader or heat sink is depicted in FIG. 21. The reduction in the junction temperature was prominent. A heat sink with pin fin provided the best performance.

Figure 22:
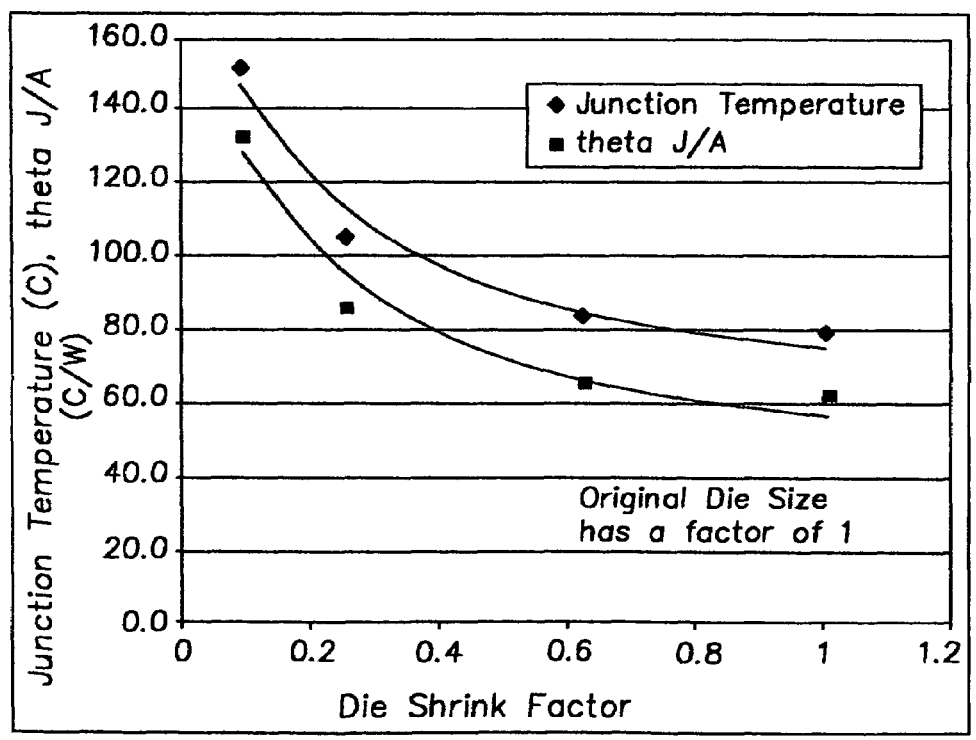
FIG. 22 is a graphical depiction of the junction temperature (C, theta J/A (C/W)) versus die shrink factor, the original die size having a factor of 1.

Die shrink without changing the aspect ratio of width to length was also investigated in this study. The plot of the results is depicted in FIG. 22. The results indicate that the smaller the die, the hotter the junction temperature. Although die shrink is an effective way of obtaining a higher number of chips per wafer, over shrink would result in higher power dissipation per unit area. Thus, a compromise must be made between good reliability and a low cost wafer.

In Table 3 (below), the maximum possible junction temperature with respective to both intrinsic and extrinsic parameters design has been summarized and assigned the impact factor of "small", "moderate" and "large", each representing a Tj reduction range of 1-5° C., 6-14° C., and 15° C. and above, respectively.

TABLE 3

Simulation result summarized for intrinsic and extrinsic parameters.

| Design | ΔT(° C.) | Impact |
|---|---|---|
| Intrinsic: | | |
| Number of Layers | −1.3 | Small |
| Number of VIAs | −6.6 | Moderate |
| Number of Thermal VIA/Balls | −7.4 | Moderate |
| Core Thickness | −2.6 | Small |
| Mold Compound Thermal Conductivity | −1.6 | Small |
| Extrinsic: | | |
| Heat Spreader | −6.1 | Moderate |
| Heat Sink Extruded Fin | −8.6 | Moderate |
| Heat Sink Pin Fin | −11.6 | Moderate |
| Air Flow Vertical Place | −22.2 | Large |
| Air Flow Horizontal Place | −18.5 | Large |

Figure 23:
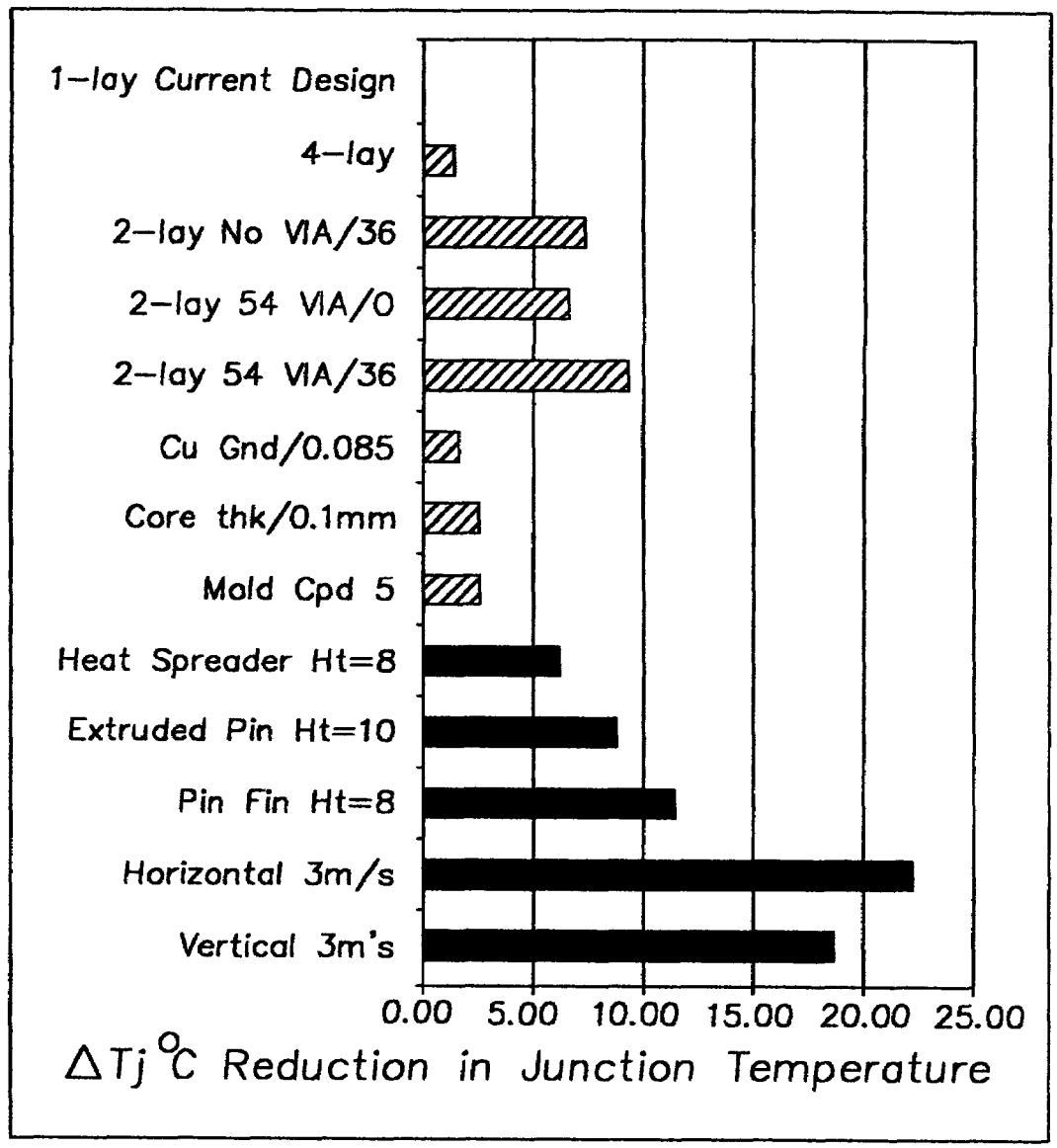
FIG. 23 is a bar chart depicting intrinsic and extrinsic parameter versus the junction temperature reduction (ΔTj° C.).

The bar chart corresponding to the results summarized in Table 3 is plotted in FIG. 23. The results show that, without relying on the addition of a heat dissipating attachment, enhanced thermal performance of a FBGA package can be achieved by the use of additional thermal via/balls, a thicker copper (ground) plane, a thinner core substrate, and optionally, a higher thermal conductivity mold compound (e.g., depending on cost).

Design validation was done in modifying the existing 1-layer 54FBGA-BOC to a 2-layer substrate with additional thermal vias/balls, a thicker copper (ground) plane, a thinner core substrate, and a mold compound with moderate thermal conductivity.

Figure 24:
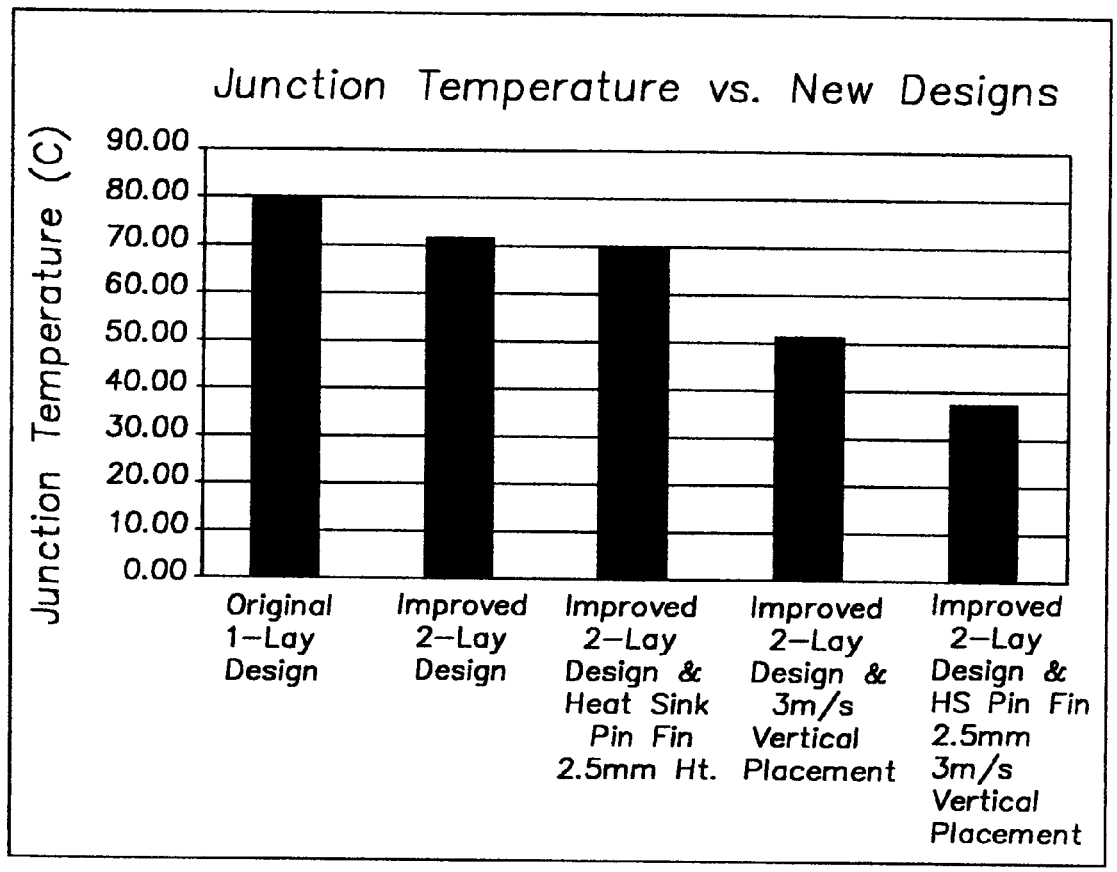
FIG. 24 is a bar chart depicting junction temperature (C) reduction versus the tested substrate designs.

The simulation shows that the re-designed package had a thermal performance about equivalent to the current 1-layer substrate design (FIG. 12) modified with an 8 mm height pin fin heat sink which reduced the junction temperature (Tj) by as much as 10° C. The results are shown in FIG. 24, and include the re-designed 54 ball FBGA substrate in a 2-layer structure with thermal via/balls, a thicker copper (ground) plane, a thinner core substrate, and a mold compound, which resulted in moderate thermal reduction between the original single-layer design and the re-design 2-layer substrate.

The validated design provides an intrinsic means of improving an FBGA package without attachment of a heat sink or heat spreader. The structure and method reduces the additional cost needed later to improve the package at the module level.

The increase in copper plane thickness ($t_2$) is an added advantage for substrate handling as it stiffens the substrate due to a high Young's modulus for copper. The overall package height remains attractive for memory application in the area of palm-top, lap-top or communication equipment like mobile phones and WAP.

Moreover, the increase of thermal solder balls at the package peripheral is an added advantage to improve the package reliability for thermal stresses in the environment testing such as Temperature Cycle and Temperature Shock.

The additional copper plane can also be used as ground plane which improves on the overall electrical performance for high frequency applications.

In summary, the extent of Tj reduction when implementing different parameters considered has been shown through a series of simulations. Attachment of an extruded or pin fin type of heat sink under convection was the most effective way of removing heat. However, due to space constraint in package z-direction, such attachments are not a preferred solution in certain memory applications. A heat spreader can be effective at a module level due to a planar space extension that is minimal in a z-direction. Traditional methods of increasing the number of layers, or using a higher thermal conductivity mold compound has proven effective for high pin count packages such as PQFP and PBGA. However, it is of insignificant impact at the level of FBGA packaging due to the much thinner package structure. The results showed that a useful FBGA 2-layer substrate design utilized thermally conductive vias for interconnection, a thicker copper plane but thinner core substrate, and additional sets of thermal VIA/Balls to enhance FBGA thermal performance as effectively as packages with external attachments. A high thermal conductivity mold compound (5W/m/k) can be useful to enhance FBGA thermal performance. A 4-metal layer substrate can achieve higher counts of I/O. A 2-copper layer substrate provides a thermal performance about equivalent to a single copper layer substrate with an 8 mm height pin fin heat sink attachment, and an about 10° C. reduction in junction temperature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed:

1. A method of fabricating a semiconductor device, comprising:

applying a heat sink layer onto a first surface of a support substrate having a thickness and a thermally conductive via interconnect extending therethrough, the heat sink comprising a thermally conductive material and having a thickness greater than the thickness of the support substrate, the heat sink layer in conductive contact with the thermally conductive via interconnect;

forming a soldermask layer directly on the heat sink layer;

forming a conductive plane layer on a second surface of the support substrate, the conductive plane layer comprising conductive traces and a plurality of ball bonding pads, each trace connected to a ball bonding pad, and the thermally conductive via interconnect connected to a ball bonding pad but not to a trace;

mounting a semiconductor die on the soldermask layer; and mounting a plurality of ball contacts onto the ball bonding pads;

wherein heat from the die passes through the heat sink layer, the via interconnect, and the ball contact connected to the via interconnect but not into the ball contacts connected to the traces, and the ball contact connected to the via interconnect is not electrically connected to the die.

2. The method of claim 1, wherein the thickness of the support substrate is less than about 20 μm and the thickness of the heat sink layer is at least about 30 μm.

3. A method of fabricating a semiconductor device comprising:

plating a layer of a thermally conductive material over sidewalls of a via hole extending through a support substrate to form a thermally conductive via interconnect, the substrate having a thickness;

applying a heat sink layer onto a first surface of the support substrate, the heat sink layer comprising a thermally conductive material and having a thickness that is greater than the thickness of the support substrate, the heat sink layer in conductive contact with the thermally conductive via interconnect;

forming a soldermask layer directly on the heat sink layer;

forming traces and a plurality of ball bonding pads on a second surface of the support substrate, each trace connected to a ball bonding pad, and the thermally conductive via interconnect connected to a ball bonding pad but not to a trace;

mounting a semiconductor die on the soldermask layer; and mounting ball contacts onto the ball bonding pads;

wherein heat from the die passes through the heat sink layer, the via interconnect, and the ball contact connected to the via interconnect but not the ball contacts connected to the traces, and the ball contact connected to the via interconnect is not electrically connected to the die.

4. The method of claim 3, wherein applying the heat sink layer comprises plating a thermally conductive metal onto the first surface of the support substrate.

5. The method of claim 4, wherein the thermally conductive metal comprises copper.

6. The method of claim 3, wherein applying the heat sink layer comprises adhering a layer of copper foil to the first surface of the support substrate.

7. A method of fabricating a semiconductor device, comprising:

mounting a semiconductor die onto a soldermask layer formed directly on a heat sink layer, the heat sink layer formed on a support substrate having a thermally conductive via interconnect extending therethrough and a thickness, the heat sink layer having a thickness that is greater than the thickness of the support substrate, the support substrate comprising a dielectric core layer interposed between a heat sink layer and a conductive plane layer, the conductive plane layer comprising conductive traces and a plurality of ball bonding pads, wherein each conductive trace is connected to a ball bonding pad and the via interconnect is connected to a ball bonding pad but not to a conductive trace; and mounting ball contacts onto the ball bonding pads;

wherein heat from the die passes though the heat sink layer, the via interconnect, and the ball contact connected to the via interconnect but not the ball contacts connected to the traces, and the ball contact connected to the via interconnect is not electrically connected to the die.

8. The method of claim 7, wherein the dielectric core layer comprises a metal/dielectric laminate.

9. The method of claim 7, wherein the dielectric core layer comprises a stage-B epoxy resin composite.

10. The method of claim 7, wherein the dielectric core layer comprises a pre-preg laminate.

11. The method of claim 7, wherein the dielectric core layer comprises polyimide tape.

12. The method of claim 7, wherein the dielectric core layer comprises a material selected from the group consisting of polyester, epoxy, urethane, polystyrene, silicone, polycarbonate, polytetrafluoroethylene, and liquid crystal polymer.

13. The method of claim 7, wherein the dielectric core layer comprises bismaleimide triazine resin, FR-4 laminate, or FR-5 laminate.

14. The method of claim 7, wherein the dielectric core layer comprises a laminate of a thermally conductive metal layer between layers of a dielectric material.

15. A method of fabricating a semiconductor device, comprising:

forming a via hole through a support substrate;

forming a via interconnect within the via hole;

forming a thermally conductive plane layer over a first side of the support substrate, and electrically conductive traces and ball bonding pads over a second side of the support substrate, each trace connected to a ball bonding pad and the via interconnect connected to a ball bonding pad but not to a trace;

forming a soldermask directly over the thermally conductive plane layer and the conductive traces, with openings exposing the ball bonding pads;

mounting a semiconductor die on the soldermask overlying the thermally conductive plane layer; and mounting ball contacts onto the ball bonding pads;

wherein heat from the die passes through the thermally conductive plane layer, the via interconnect, and the ball contact connected to the via interconnect but not into the ball contacts connected to the traces.

16. A method of fabricating a semiconductor device, comprising:

forming a plurality of thermally conductive via interconnects extending through a core support substrate from the first side to the second side;

forming a metal grounding layer on the first side of the core substrate;

forming a soldermask layer directly on the metal grounding layer;

mounting a semiconductor die on the soldermask layer;

forming a plurality of traces and bond pads on the second side of the core substrate, the bond pads arranged in a ball grid array and each trace connected to a ball pad, and each via interconnect connected to a ball pad but not to a trace; and mounting ball contacts on the ball pads;

wherein heat from the die passes through the metal grounding layer, the via interconnects, and into the ball contacts connected to the via interconnects but not into the ball contacts connected to the traces, and the ball contacts connected to the via interconnects are not electrically connected to the die.

17. A method of fabricating a semiconductor device, comprising:
   forming a copper heat sink layer over a first side of a polyimide tape, the heat sink layer having a thickness greater than the polyimide tape, and via interconnects extending through the polyimide tape;
   forming a soldermask layer directly on the copper heat sink layer;
   mounting a semiconductor die on the soldermask layer;
   forming signal traces and ball bonding pads on a second side of the polyimide tape; each trace connected to a ball bonding pad and each via interconnect connect to a ball bonding pad that is not connected to a trace; and
   mounting ball contacts on the ball bonding pads;
   wherein heat from the die passes through the heat sink layer, the via interconnects, and into the ball contacts connected to the via interconnects but not into the ball contacts connected to the traces, and the ball contacts connected to the via interconnects are not electrically connected to the die.

18. A method of fabricating a semiconductor device, comprising:
   mounting a die on a soldermask layer formed on a conductive layer on a first side of a substrate;
   forming first and second sets of contact bonding pads on a second side of the substrate with traces connected to said contact bonding pads such that via interconnects extending through the substrate are connected through the traces to the second set of contact bonding pads but not the first set of contact bonding pads; and
   mounting contacts on the contact bonding pads;
   wherein heat generated from the die is passed through the conductive layer, the via interconnects, and into the contacts mounted on the second set of contact bonding pads but not into the contacts mounted on the first set of the contact bonding pads, and the contacts mounted on the second set of contact bonding pads are not electrically connected to the die.

19. A method of fabricating a semiconductor device, comprising:
   applying a copper heat sink layer on a first side of a polyimide tape, the tape having a thickness; the heat sink layer having a thickness greater than the thickness of the tape;
   applying an insulative layer directly over the copper heat sink layer;
   mounting a semiconductor die on the insulative layer;
   forming signal traces on a second side of the polyimide tape; and
   mounting contacts on contact pads situated on the second side of the polyimide tape, said contact pads connected to via interconnects extending through the thickness of the tape but not to the signal traces and not electrically connected to the die such that heat from the die passes into the copper heat sink layer, the via interconnects, and into the contacts but not into the signal traces.

20. A method of fabricating a semiconductor device, comprising:
   forming a thermally conductive plane layer over a first side of a support substrate;
   forming a soldermask layer directly on the thermally conductive plane layer;
   mounting a semiconductor die on the soldermask layer;
   forming a layer of electrically conductive traces and first and second sets of contact bonding pads on a second side of the support substrate, each of the traces connected to one or more thermal via interconnects extending through the support substrate, each of the first set of contact bonding pads electrically connected to one or more of said traces and each of the second set of contact bonding pads not connected to said traces;
   mounting electrically conductive contacts onto the first set of contact bonding pads and thermally conductive contacts onto the second set of contact bonding pads, wherein the thermally conductive contacts are in contact with the thermal via interconnects but not with the traces such that the thermally conductive contacts are not electrically connected to the die, and heat from the die is passed through the thermally conductive plane layer, the via interconnects, and the thermally conductive contacts but not through the electrically conductive contacts.

21. A method of fabricating a semiconductor device, comprising:
   forming a thermally conductive plane layer over a first side of a support substrate;
   forming a first soldermask over the thermally conductive plane layer;
   mounting a semiconductor die over the first soldermask;
   forming a layer of electrically conductive traces and first and second sets of ball bonding pads on a second side of the support substrate, each of the traces connected to one or more thermal via interconnects extending through the support substrate, each of the first set of ball bonding pads electrically connected to one or more of said traces and each of the second set of ball bonding pads not connected to said traces;
   forming a second soldermask over the traces with openings exposing the ball bonding pads;
   mounting electrically conductive contacts onto the first set of contact bonding pads and thermally conductive contacts onto the second set of contact bonding pads, wherein the thermally conductive contacts are in contact with the thermal via interconnects but not with the traces such that the thermally conductive contacts are not electrically connected to the die, and heat from the die passes through the thermally conductive plane layer, the via interconnects, and into the thermally conductive contacts but not through the electrically conductive contacts.

22. A method of fabricating a semiconductor device, comprising:
   forming a plurality of thermally conductive plated through-hole via interconnects extending through an insulative support substrate;
   applying a layer of a thermally conductive material on a first surface of the insulative support substrate;
   forming electrically conductive traces and contact pads on a second side of the insulative support substrate, the contact pads connected to a via interconnect but not to the traces;
   forming a soldermask layer over the thermally conductive layer;
   mounting a semiconductor die on the soldermask layer; and
   mounting thermally conductive contacts on the contact pads;
   wherein heat from the die passes through the via interconnects into the thermally conductive contacts but not into the traces, and the thermally conductive contacts are not electrically connected to the die.

23. The method of claim 22, further comprising at least partially encapsulating the device to form a die package.

24. A method of fabricating a semiconductor device, comprising:
- forming one or more thermally conductive plated through-hole via interconnects through an insulative support substrate;
- forming a thermally conductive layer on a first side of the support substrate;
- forming a soldermask layer on the thermally conductive layer;
- mounting a semiconductor die on the soldermask layer;
- forming electrically conductive traces on a second side of the support substrate; and
- mounting contacts on bonding pads on the second side of the support substrate, said bonding pads connected to the via interconnects but not to the traces;
- wherein heat generated from the die is dispersed through the thermally conductive layer and the via interconnects into the contacts but not into the traces, and the contacts are not electrically connected to the die.

25. The method of claim 24, further comprising applying a molding compound onto the semiconductor device to at least partially encapsulate the device.

26. A method of fabricating a semiconductor device, comprising:
- forming one or more thermally conductive via interconnects through a support substrate comprising an epoxy resin composite;
- forming a thermally conductive layer on a first side of the support substrate;
- forming a soldermask layer directly on the thermally conductive layer;
- forming electrically conductive traces and first and second sets of contact bonding pads on a second side of the support substrate, the first set of contact bonding pads connected to the conductive traces, and the second set of contact bonding pads connected to the via interconnects but not to the conductive traces;
- mounting a semiconductor die on the soldermask layer; and
- mounting contacts onto the first and second sets of contact bonding pads;
- wherein heat generated from the die is dispersed through the thermally conductive layer, the via interconnects, and into the contacts mounted on the second set of contact bonding pads but not into the contacts mounted on the first set of contact bonding pads, and the contacts mounted on the second set of contact bonding pads are not electrically connected to the die.

27. A method of fabricating a semiconductor device, comprising:
- applying a soldermask layer onto a heat sink layer, the heat sink layer formed on a first surface of a substrate, the substrate comprising a thermally conductive via interconnect extending therethrough;
- forming traces and a plurality of ball bonding pads on a second surface of the substrate, each trace connected to a ball bonding pad, and the thermally conductive via interconnect connected to a ball bonding pad but not to a trace;
- mounting a semiconductor die on the heat sink layer; and
- mounting ball contacts on the ball bonding pads;
- wherein heat from the die passes through the heat sink layer, the via interconnect, and into the ball contact connected to the via interconnect but not into the ball contacts connected to the traces, and the ball contacts connected to the via interconnect are not electrically connected to the die.

* * * * *

UNITED STATES PATENT AND TRADEMARK OFFICE
CERTIFICATE OF CORRECTION

| | | |
|---|---|---|
| PATENT NO. | : 7,459,346 B2 | Page 1 of 1 |
| APPLICATION NO. | : 11/089254 | |
| DATED | : December 2, 2008 | |
| INVENTOR(S) | : Yee et al. | |

It is certified that error appears in the above-identified patent and that said Letters Patent is hereby corrected as shown below:

In column 1, line 8, after "Jun. 17, 2002" insert -- , now Pat No. 7,138,711 --.

In column 16, line 7, in Claim 7, delete "though" and insert -- through --, therefor.

Signed and Sealed this

Third Day of February, 2009

JOHN DOLL
*Acting Director of the United States Patent and Trademark Office*